(12) United States Patent
Wakamatsu et al.

(10) Patent No.: US 11,769,862 B2
(45) Date of Patent: Sep. 26, 2023

(54) LIGHT EMITTING DEVICE

(71) Applicant: NICHIA CORPORATION, Anan (JP)

(72) Inventors: Dai Wakamatsu, Komatsushima (JP);
Kimihiro Miyamoto, Tokushima (JP);
Kensuke Yamaoka, Tokushima (JP);
Yoshiyuki Ide, Anan (JP)

(73) Assignee: NICHIA CORPORATION, Anan (JP)

( * ) Notice: Subject to any disclaimer, the term of this patent is extended or adjusted under 35 U.S.C. 154(b) by 113 days.

(21) Appl. No.: 17/211,473

(22) Filed: Mar. 24, 2021

(65) Prior Publication Data
US 2021/0305473 A1 Sep. 30, 2021

(30) Foreign Application Priority Data

Mar. 26, 2020 (JP) ................. 2020-055285
Sep. 28, 2020 (JP) ................. 2020-161763
Oct. 27, 2020 (JP) ................. 2020-179674

(51) Int. Cl.
*H01L 33/48* (2010.01)
*H01L 33/62* (2010.01)
*H01L 25/075* (2006.01)
*H01L 33/64* (2010.01)
*H01L 33/60* (2010.01)
*H01L 33/50* (2010.01)

(52) U.S. Cl.
CPC ........ *H01L 33/483* (2013.01); *H01L 25/0753* (2013.01); *H01L 33/50* (2013.01); *H01L 33/60* (2013.01); *H01L 33/62* (2013.01); *H01L 33/641* (2013.01)

(58) Field of Classification Search
CPC ... H01L 33/483; H01L 33/62; H01L 25/0753; H01L 33/60; H01L 33/641
See application file for complete search history.

(56) References Cited

U.S. PATENT DOCUMENTS

| | | | | |
|---|---|---|---|---|
| 5,327,443 A | * | 7/1994 | Tanaka | ............... H01S 5/02255 372/36 |
| 5,621,636 A | * | 4/1997 | Tanigawa | ............... H01F 19/04 363/147 |
| 2008/0315214 A1 | | 12/2008 | Wall et al. | |
| 2010/0270580 A1 | * | 10/2010 | Posselt | ................... H01L 33/62 257/E33.059 |
| 2013/0168723 A1 | | 7/2013 | Kasae et al. | |

(Continued)

FOREIGN PATENT DOCUMENTS

| | | |
|---|---|---|
| JP | 2006-278766 A | 10/2006 |
| JP | 2010-530631 A | 9/2010 |

(Continued)

*Primary Examiner* — Feifei Yeung Lopez
(74) *Attorney, Agent, or Firm* — Foley & Lardner LLP

(57) ABSTRACT

A light emitting device includes: a first substrate including: a first lead, and a second lead positioned apart from the first lead; a second substrate disposed on an upper face of the second lead, the second substrate including: a base, and a first conducting part disposed on an upper face of the base; a light emitting element disposed on the second substrate and electrically connected to the first conducting part; a first wire electrically connecting the first lead and the first conducting part; and a wall part straddling and covering an upper face of the first lead and an upper face of the second lead. A height of the wall part is less than a height of the second substrate.

21 Claims, 20 Drawing Sheets

(56) References Cited

U.S. PATENT DOCUMENTS

| | | | |
|---|---|---|---|
| 2014/0175481 A1* | 6/2014 | Tischler | H01L 31/02325 |
| | | | 257/98 |
| 2015/0070909 A1 | 3/2015 | Jung et al. | |
| 2015/0340572 A1 | 11/2015 | Kasae et al. | |
| 2016/0013382 A1 | 1/2016 | Ozeki et al. | |
| 2016/0313498 A1 | 10/2016 | Oh et al. | |
| 2017/0288104 A1 | 10/2017 | Ukawa et al. | |
| 2017/0345985 A1 | 11/2017 | Ide | |
| 2018/0159006 A1 | 6/2018 | Hayashi et al. | |
| 2018/0172899 A1 | 6/2018 | Oh et al. | |
| 2018/0261740 A1 | 9/2018 | Ozeki et al. | |
| 2019/0103525 A1 | 4/2019 | Bando et al. | |
| 2019/0139882 A1* | 5/2019 | Sato | H02M 7/003 |
| 2020/0064566 A1* | 2/2020 | Ishigaki | G02B 6/4272 |
| 2020/0168776 A1 | 5/2020 | Ukawa et al. | |

FOREIGN PATENT DOCUMENTS

| | | |
|---|---|---|
| JP | 2011-009143 A | 1/2011 |
| JP | 2013-125776 A | 6/2013 |
| JP | 2013-153157 A | 8/2013 |
| JP | 2013-153158 A | 8/2013 |
| JP | 2014-212248 A | 11/2014 |
| JP | 2015-070199 A | 4/2015 |
| JP | 2015-216153 A | 12/2015 |
| JP | 2016-019000 A | 2/2016 |
| JP | 2016-181653 A | 10/2016 |
| JP | 2016-208037 A | 12/2016 |
| JP | 2017-183578 A | 10/2017 |
| JP | 2017-216315 A | 12/2017 |
| JP | 2019-087729 A | 6/2019 |
| JP | 2020-017711 A | 1/2020 |
| JP | 2020-092251 A | 6/2020 |
| WO | WO-2012/101815 A1 | 6/2014 |
| WO | WO-2017/026093 A1 | 5/2018 |

\* cited by examiner

LIGHT EMITTING DEVICE

CROSS-REFERENCE TO RELATED APPLICATIONS

This application claims priority to Japanese Patent Application No. 2020-055285, filed on Mar. 26, 2020, Japanese Patent Application No. 2020-161763, filed on Sep. 28, 2020, and Japanese Patent Application No. 2020-179674, filed on Oct. 27, 2020, the disclosures of which are hereby incorporated by reference in their entireties.

BACKGROUND

The present disclosure relates to a light emitting device. Light emitting devices employing LEDs and the like are used in numerous devices, including backlights for, for example, displays and lighting fixtures, because they can easily achieve high emission efficiency. Japanese Patent Publication No. 2013-125776 discloses a light emitting device including a resin part that includes a pair of positive and negative leads and a recessed part, and a light emitting element mounted on the bottom face of the recessed part of the resin part.

SUMMARY

There is a need to further improve the light extraction efficiency and the reliability of a light emitting device. With respect to improving reliability, for example, there is a need to reduce the occurrence of separation between the leads and resin part. Accordingly, one object of certain embodiments of the present disclosure is to provide a light emitting device that has high light extraction efficiency and reduced occurrence of separation between the leads and resin part.

According to one embodiment, a light emitting device includes: a first substrate, a second substrate, a light emitting element, and a wall part. The first substrate includes a first lead and a second lead positioned apart from the first lead. The second substrate is disposed on an upper face of the second lead, and includes a base and a first conducting part disposed on an upper face of the base. The light emitting element is disposed on the second substrate, and is electrically connected to the first conducting part. The first wire electrically connects the first lead and the first conducting part. The wall part straddles and covers an upper face of the first lead and an upper face of the second lead. A height of the wall part is smaller than a height of the second According to one embodiment of the present disclosure, a light emitting device which has high light extraction efficiency and reduced occurrence of separation between the leads and resin part can be provided.

DETAILED DESCRIPTION

Figure 1A:
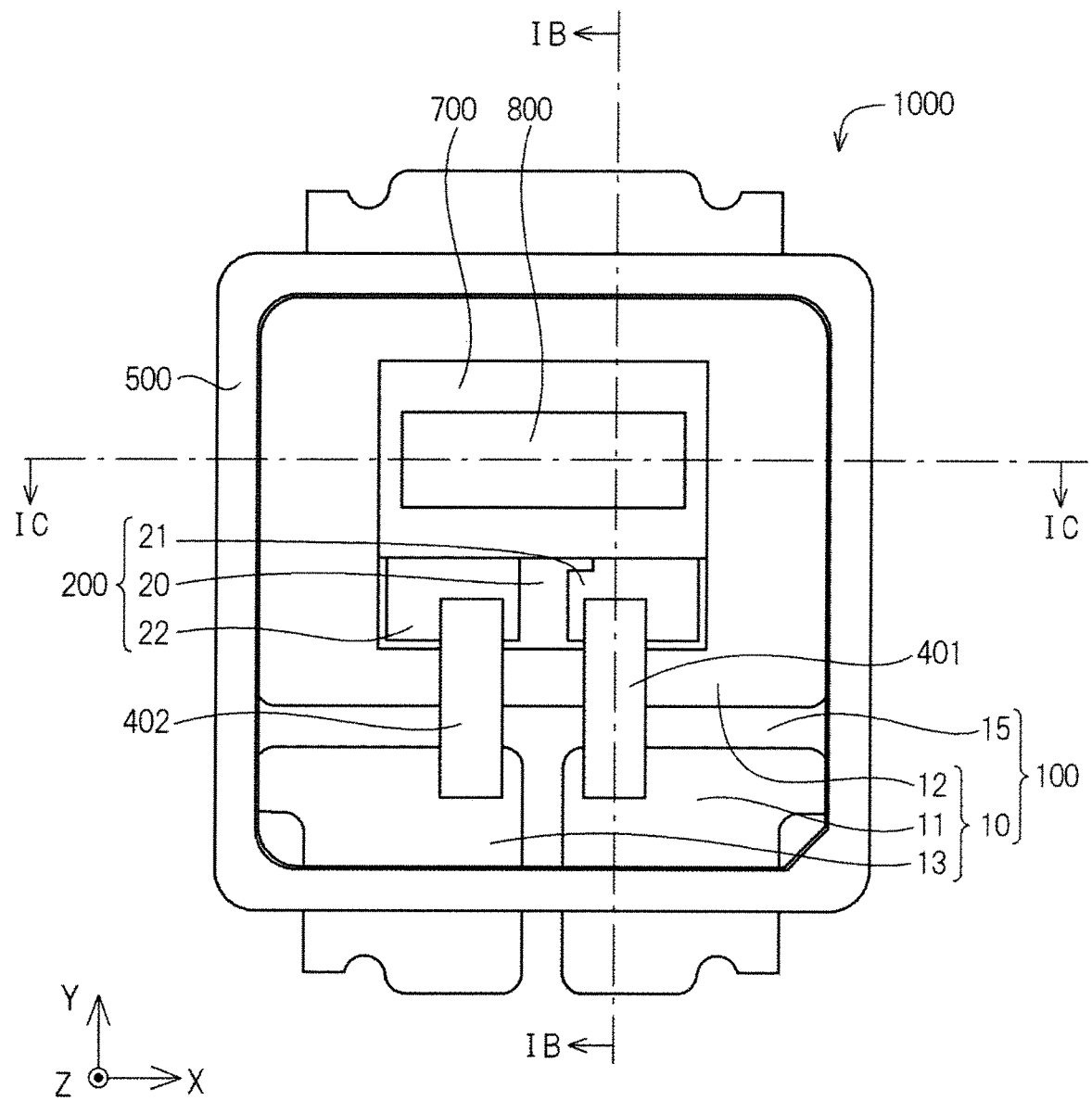
FIG. 1A is a schematic top view of a light emitting device according to one embodiment.

Certain light emitting devices according to the present disclosure will be explained in detail with reference to the accompanying drawings. The light emitting devices disclosed are illustrative, and the present invention is not limited to those described below. In the description below, terms indicating specific directions or positions (e.g., "upper," "upward," "lower," "downward," and other terms including these) might be used. However, these terms are merely used to make the relative directions or positions in the drawings being referenced more easily understood. The sizes or relative positions of the constituent elements shown in the drawings might be exaggerated to make them more easily understood, and might not reflect the sizes of or the magnitude relation between the constituent elements in an actual light emitting device.

Embodiment 1

A light emitting device 1000 according to Embodiment 1 of the present disclosure will be explained based on FIG. 1A to FIG. 9B. The light emitting device 1000 includes a first substrate 100, a second substrate 200, a light emitting element 300, a first wire 401, and a wall part 500. The first substrate 100 includes a first lead 11, a second lead 12 positioned apart from the first lead 11, and a resin part 15 that holds in place the first lead 11 and the second lead 12. The first lead 11 and the second lead 12 are arranged along a first direction. In FIG. 1A, the first direction is along the Y direction. The direction perpendicular to the first direction is designated as the second direction. In FIG. 1A, the second direction is along the X direction. The direction perpendicular to the first and second directions is designated as the third direction. In FIG. 1A, the third direction is along the Z direction. The second substrate 200 is disposed on the second lead 12. The second substrate 200 includes a base 20 and a first conducting part 21 positioned on the upper face of the base 20. At least one light emitting element 300 is disposed on the second substrate 200. The light emitting element 300 is electrically connected to the first conducting part 21. The first wire 401 electrically connects the first lead 11 and the first conducting part 21. The wall part 500 straddles and covers the upper faces of the first lead 11 and the second lead 12. The height H5 of the wall part 500 is smaller than the height H2 of the second substrate 200. In the description herein, the height of each part is the maximum distance from the uppermost face of the second lead 12 to the upper face of the each part in the third direction (Z direction). The uppermost face of the second lead 12 is the upper face of the second lead 12 positioned farthest in the +Z direction (upward) in the third direction.

In the light emitting device 1000, the first lead 11 and the second lead 12 are held in place by the wall part 500 because the wall part 500 straddles and covers the upper faces of the first lead 11 and the second lead 12. This may reduce the deformation of the first lead 11 and/or the second lead 12 attributable to, for example, the heat from the light emitting element. This may reduce the occurrence of separation between the leads and the resin part.

The light emitting device 1000 having a wall part 500 whose height H5 is smaller than the height H2 of the second substrate 200 can reduce the occurrence of the wall part 500 blocking the light from the light emitting element. This can improve the light extraction efficiency of the light emitting device.

Figure 2A:
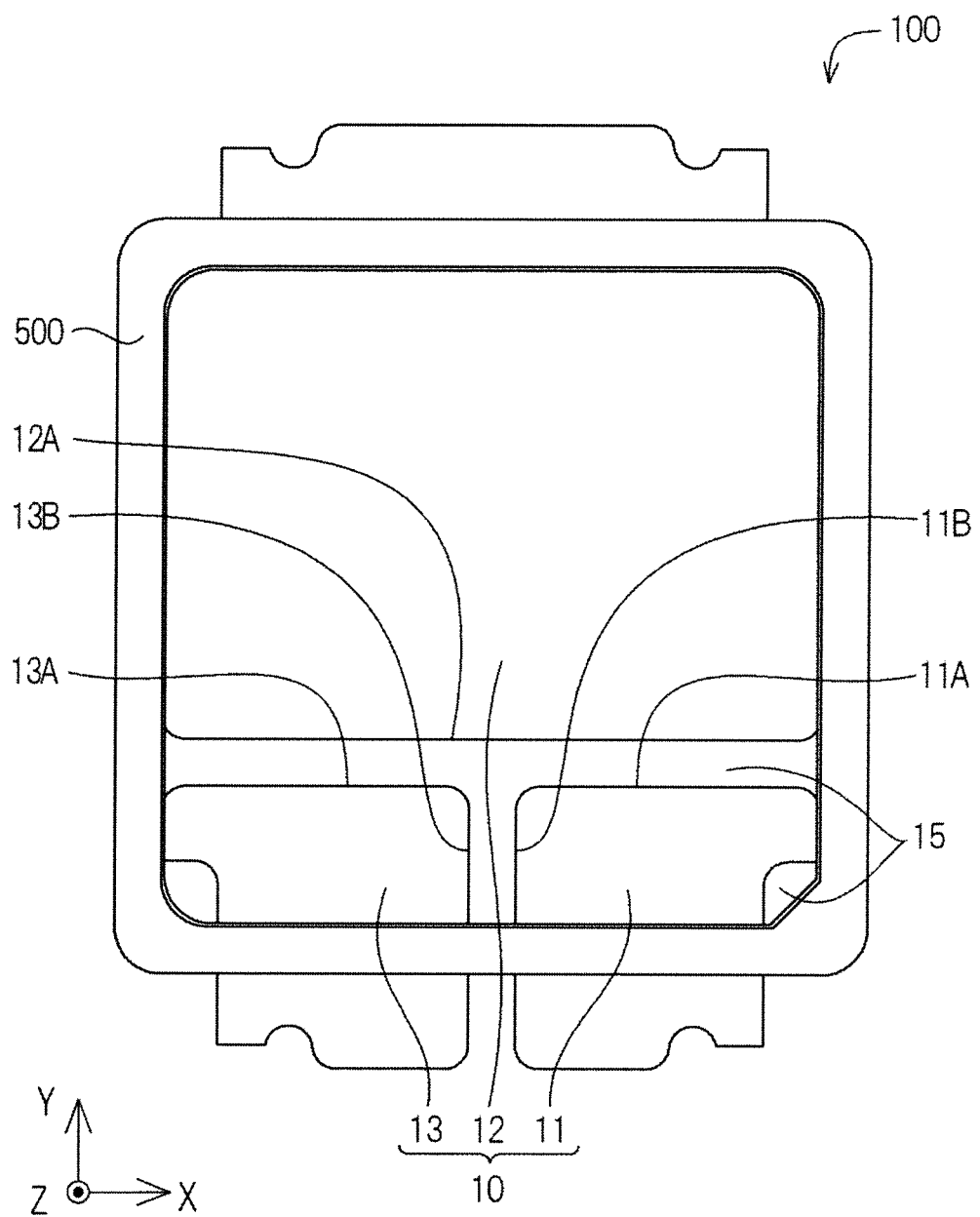
FIG. 2A is a schematic top view of a first substrate of the light emitting device according to the embodiment.

The first substrate 100 includes a resin part 15 that holds the leads 10 in place. The leads 10 include a first lead 11 and a second lead 12. For example, the leads 10 may include only a first lead 11 and a second lead 12 as shown in FIG. 2C, or may include a first lead 11, a second lead 12, and a third lead 13 as shown in FIG. 2A. The first substrate 100 shown in FIG. 2A includes a third lead 13 positioned apart from both the first lead 11 and the second lead 12. In the case in which the first substrate 100 includes a third lead 13, the wall part 500 preferably straddles and covers the upper faces of the second lead 12 and the third lead 13. This can allow the wall part 500 to hold in place the second lead 12 and the third lead 13, thereby reducing the occurrence of separation between the leads 10 and the resin part 15. The wall part 500 preferably surrounds the second substrate 200 without any break in a top view. This can enhance the strength of the wall part 500, thereby enhancing the power of the wall part 500 to hold in place the first lead 11 and the second lead 12. This can reduce the occurrence of separation between the leads and the resin part. The leads 10 can include two or more leads, and can include four or more leads.

There is no particular restriction for the areas of the first lead 11 and the second lead 12 in the top view, but the area of the second lead 12 is preferably larger than the area of the first lead 11 in the top view. Because the second substrate 200 bearing the light emitting element 300 is disposed on the second lead 12, the second lead 12 having a larger area can improve the heat dissipation performance of the light emitting device 1000. In the case in which the first substrate 100 includes a first lead 11, a second lead 12, and a third lead 13, the area of the second lead 12 in the top view is preferably larger than each of the area of the first lead and the area of the third lead. This can improve the heat dissipation performance of the light emitting device 1000. In the case in which the first substrate 100 includes a first lead 11, a second lead 12, and a third lead 13, the area of the second lead 12 is larger than the sum of the areas for the first and third leads in the top view. This can further improve the heat dissipation performance of the light emitting device 1000.

As shown in FIG. 2A, the first lead 11 opposes the second lead 12 in the first direction (Y direction). In the top view, it is preferable for the second lead 12 to face the third lead 13 in the first direction (Y direction), and for the first lead 11 to face the third lead 13 in the second direction (X direction). Accordingly, the first lead 11 and the third lead are arranged along the second direction (X direction), thereby facilitating reduction in the size of the light emitting device 1000 in the first direction (Y direction). Arranging the second lead 12 to oppose both the first lead 11 and the third lead 13 in the first direction (Y direction) can make it easier to increase the length of the second lead 12 in the second direction (X direction). This can increase the area of the second lead 12 in the top view, thereby improving the heat dissipation performance of the light emitting device 1000.

As shown in FIG. 2A, in the top view, at least a portion of the outer edge 11A of the first lead 11 and at least a portion of the outer edge 12A of the second lead 12 that face each other in the first direction (Y direction) are preferably in parallel. This can increase the region where the distance between the first lead 11 and the second lead 12 is constant. For example, in the case of forming the resin part 15 by injecting an uncured resin material between the first lead 11 and the second lead 12, a region of a constant distance where the first lead 11 and the second lead 12 face each other can increase, thereby reducing the occurrence of the space not being filled with the uncured resin material. In the description herein, being in parallel includes allowable variations of up to ±3°. Similarly, in the top view, at least a portion of the outer edge 12A of the second lead 12 and at least a portion of the outer edge 13A of the third lead 13 that face each other in the first direction (Y direction) are preferably in parallel. Moreover, in the top view, at least a portion of the outer edge 11B of the first lead 11 and at least a portion of the outer edge 13B of the third lead 13 that face each other in the second direction (X direction) are preferably in parallel.

In the top view, the first lead 11 and the third lead 13 have line symmetry using the central line of the first substrate 100 parallel to the first direction (Y direction) as the line of symmetry. This can make it easy to design a mounting substrate for mounting the light emitting device. In the description herein, the line symmetry includes allowable variations in the shape of up to ±3%.

Figure 2B:
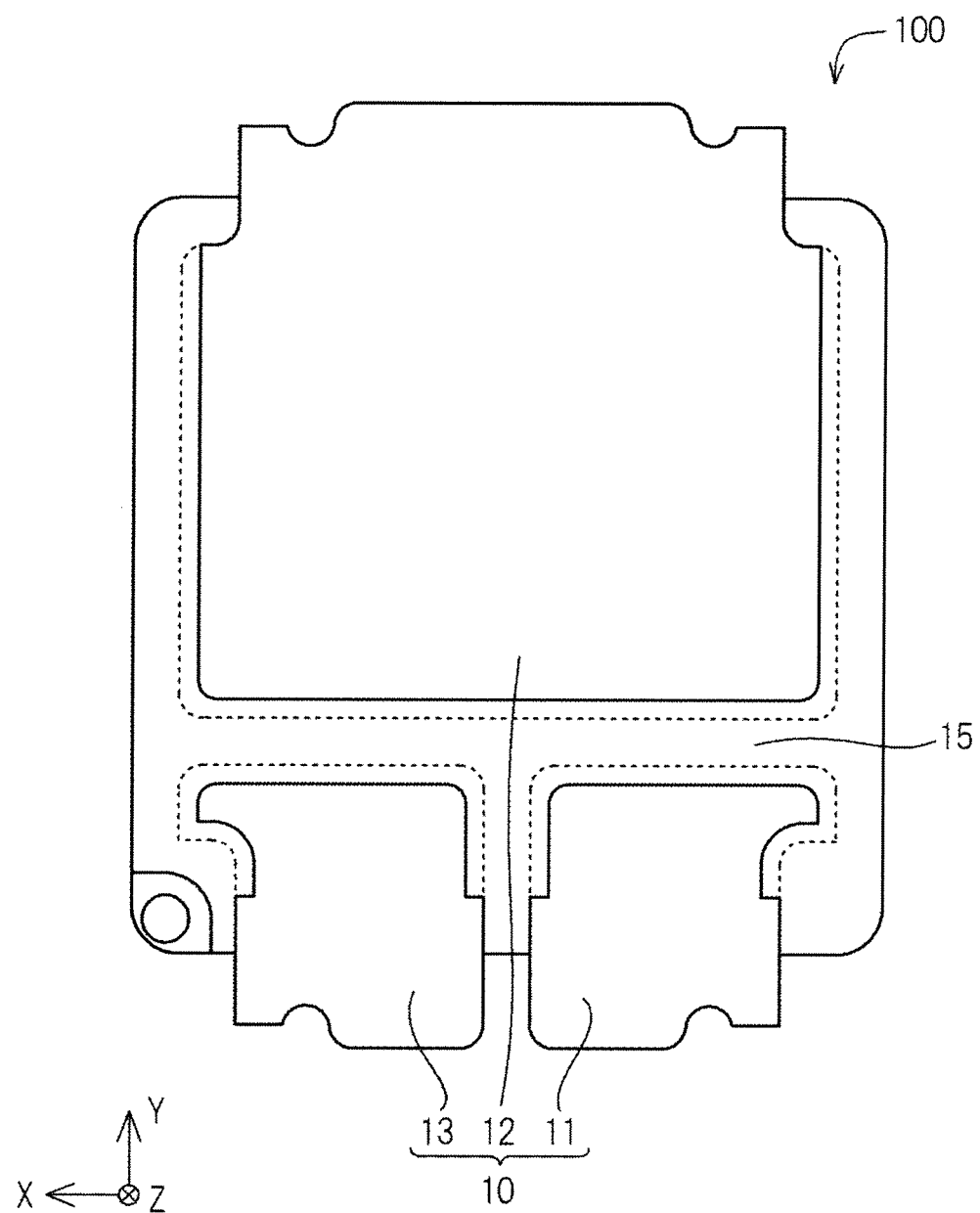
FIG. 2B is a schematic bottom view of the first substrate of the light emitting device according to the embodiment.
Figure 2C:
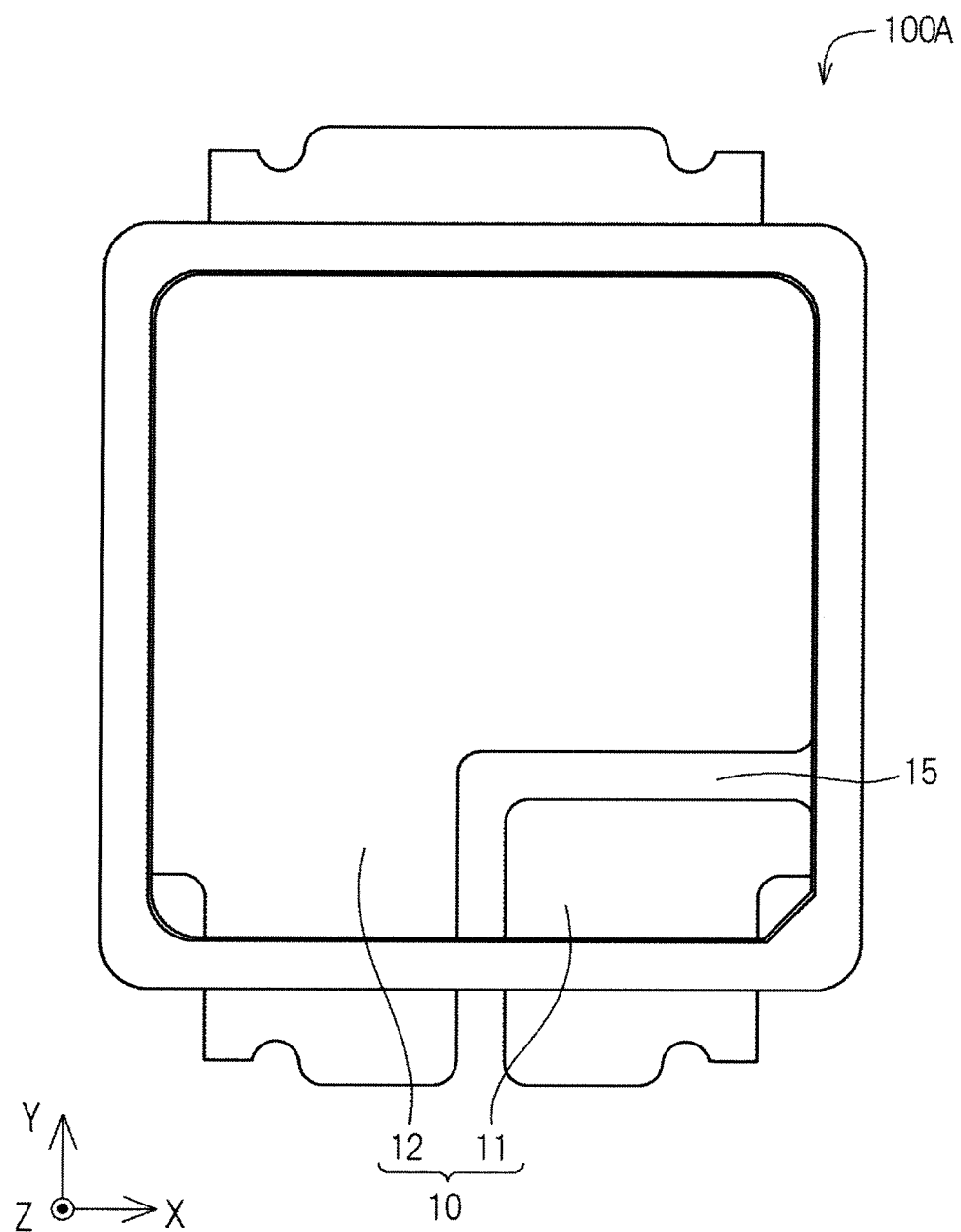
FIG. 2C is a schematic top view of Variation 1 of the first substrate of the light emitting device according to the embodiment.

As shown in FIG. 2B, the lower face of the first lead 11 and the lower face of the second lead 12 are preferably exposed from the resin part 15. This can make it easy to supply power from the lower faces of the first lead 11 and the second lead 12. This can also facilitate heat transfer from the lower face of the first lead 11 and/or the lower face of the second lead 12 to the mounting substrate on which the light emitting device is mounted. This can improve the heat dissipation performance of the light emitting device. In the case in which the lower face of the first lead 11 and the lower face of the second lead 12 are exposed from the resin part 15, the lower face of the first lead 11, the lower face of the second lead 12, and the lower face of the resin part 15 are preferably coplanar. In such a structure, the resin part 15 does not extends beyond the lower face of the first lead 11 and the lower face of the second lead 12, so that power supply can be easily achieved from the lower face of the first lead 11 and the lower face of the second lead 12. The lower face of the first lead 11, the lower face of the second lead 12, and the lower face of the resin part 15 being coplanar allows the resin part 15 to cover portions of the lateral faces of the first lead 11 closer to the lower face and portions of the lateral faces of the second lead 12 closer to the lower face. In other words, it suppresses the portions of the lateral faces of the first lead 11 closer to the lower face and the portions of the lateral faces of the second lead 12 closer to the lower face from being exposed from the resin part 15. This can increase the contact areas between the resin part 15 and the lateral faces of the first lead 11, and the contact areas between the resin part 15 and the second lead 12. Increasing the contact areas between the resin part 15 and the lateral faces of the first lead 11 and the second lead 12 can reduce the occurrence of separation between the leads and the resin part. In the description herein, being coplanar includes allowable variations of up to ±15 μm.

In the case in which the first substrate 100 has a first lead 11, a second lead 12, and a third lead 13, the second lead 12 is not preferably electrically connected to the light emitting element 300. Because the second substrate bearing a light emitting element is disposed on the second lead 12, the second lead 12 is required to have higher heat dissipation performance than the first lead 11 and the third lead 13. The second lead 12 not electrically connected to the light emitting element 300 can simplify the thermal design of the mounting substrate on which the light emitting device 1000 will be mounted. In other words, an electrical connection with the light emitting element 300 in the portion of the mounting substrate to be joined with the second lead 12 does not have to be taken into consideration. Accordingly, the thermal design of the mounting substrate is made easy.

Figure 1B:
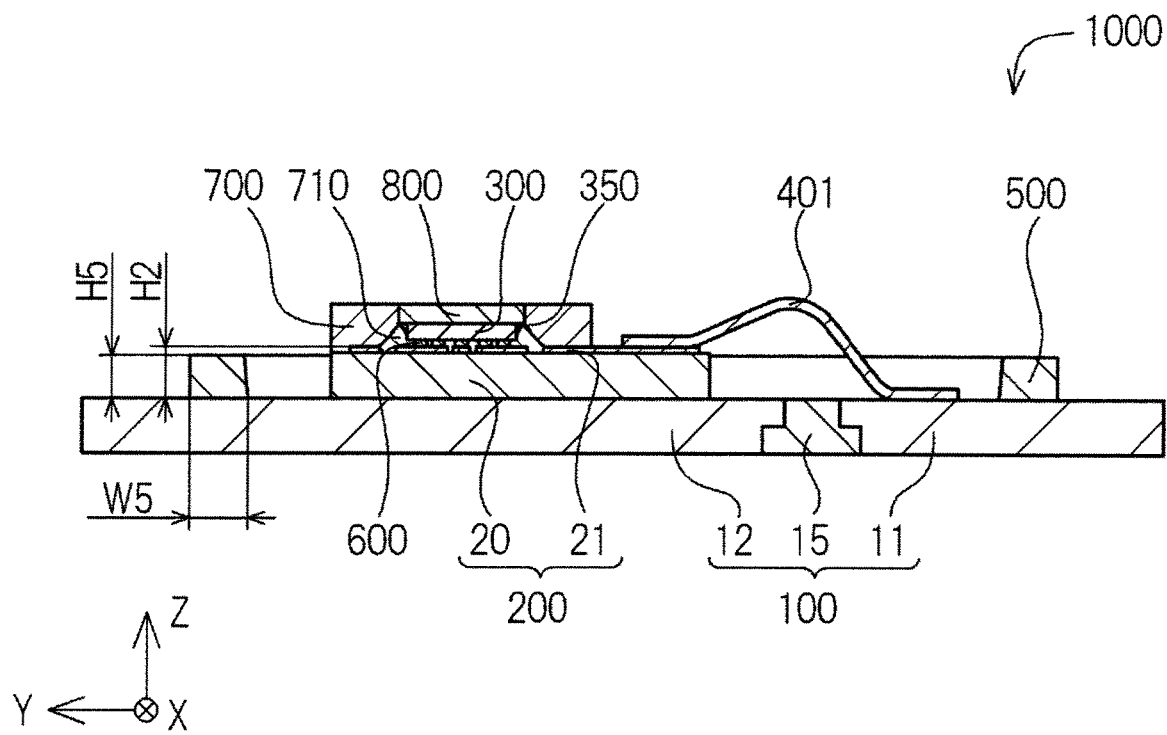
FIG. 1B is a schematic cross-sectional view taken along line IB-IB in FIG. 1A.
Figure 1C:
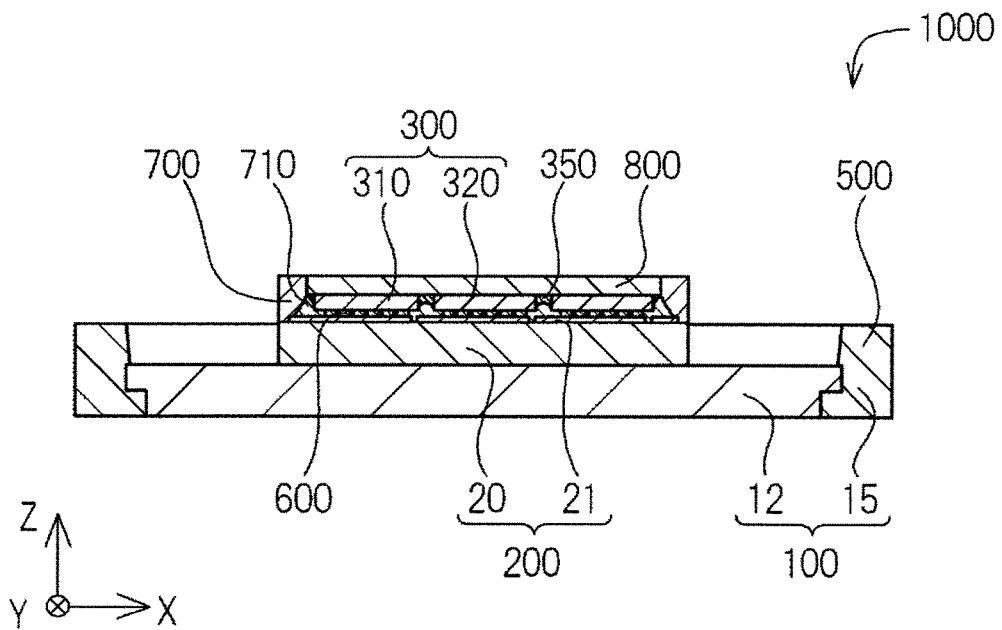
FIG. 1C is a schematic cross-sectional view taken along line IC-IC in FIG. 1A.
Figure 3:
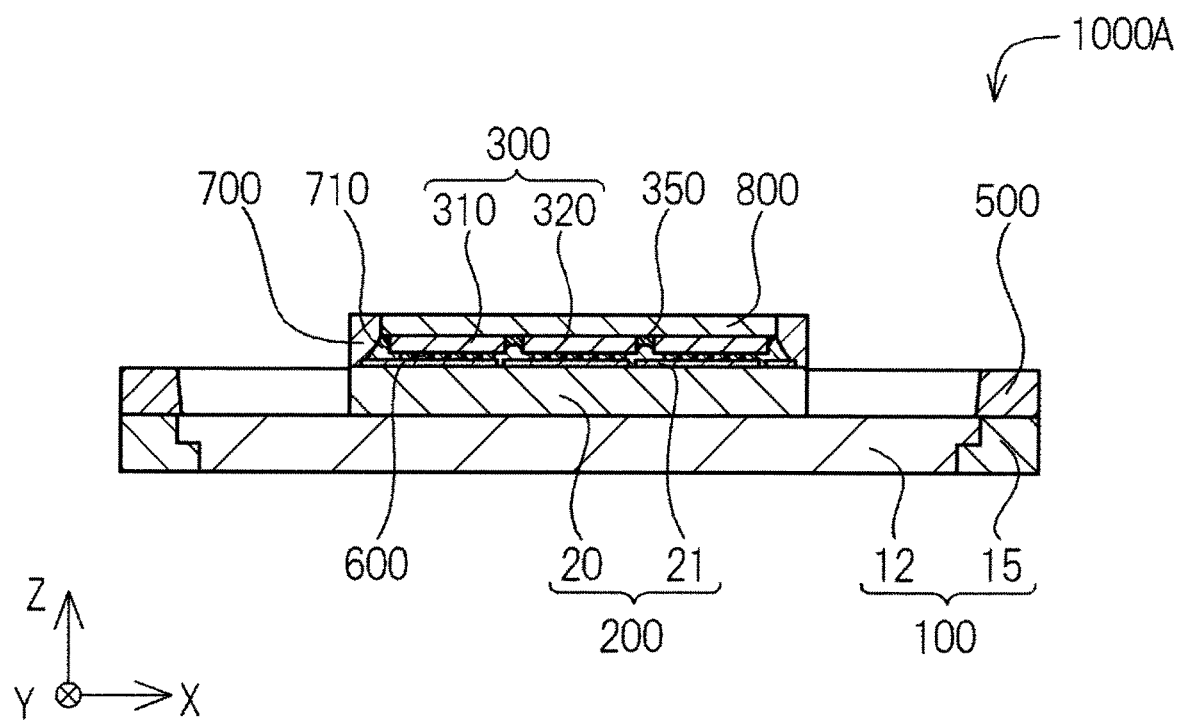
FIG. 3 is a schematic cross-sectional view of Variation 1 of the light emitting device according to the embodiment.
Figure 4A:
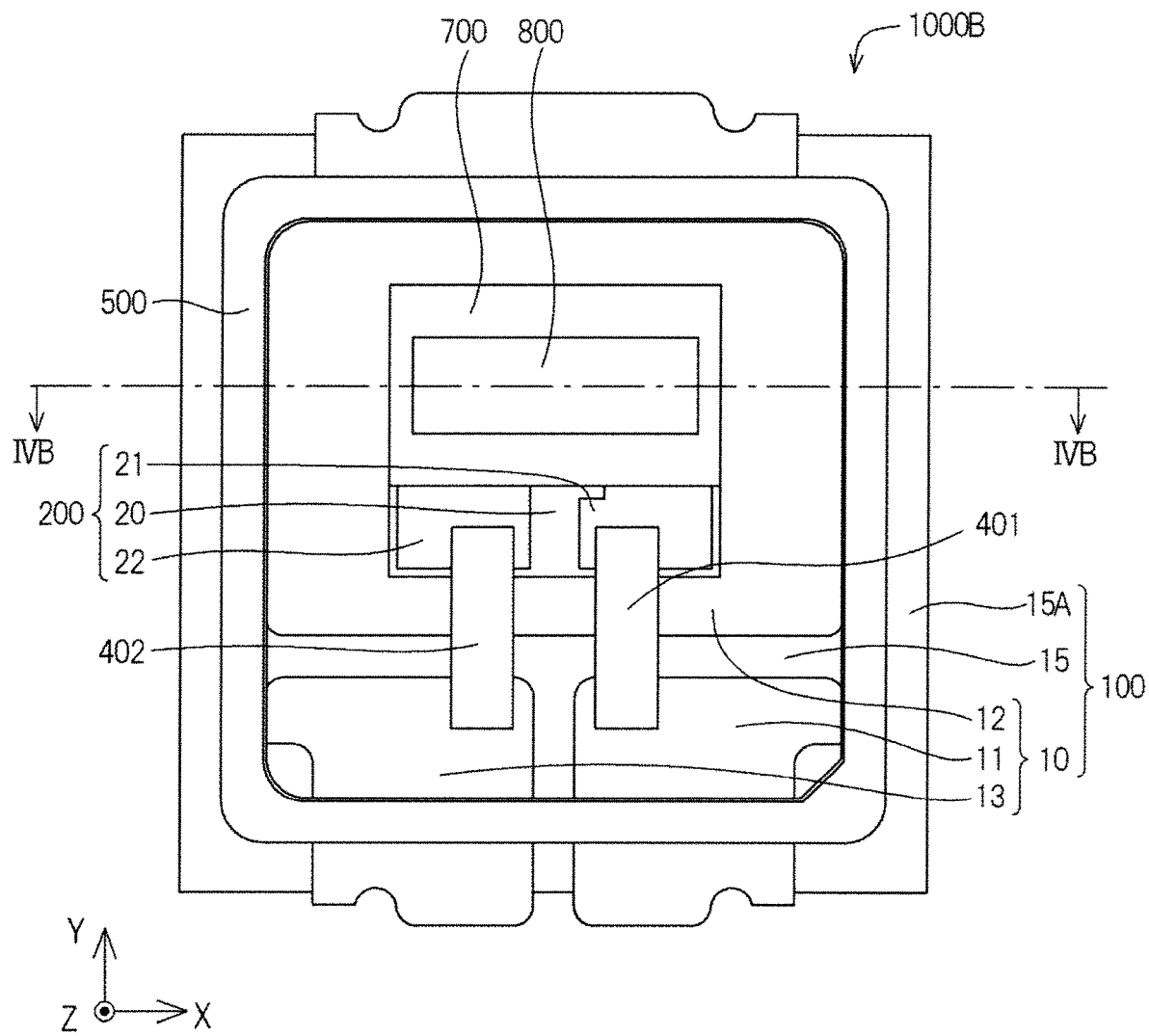
FIG. 4A is a schematic top view of Variation 2 of the light emitting device according to the embodiment.
Figure 4B:
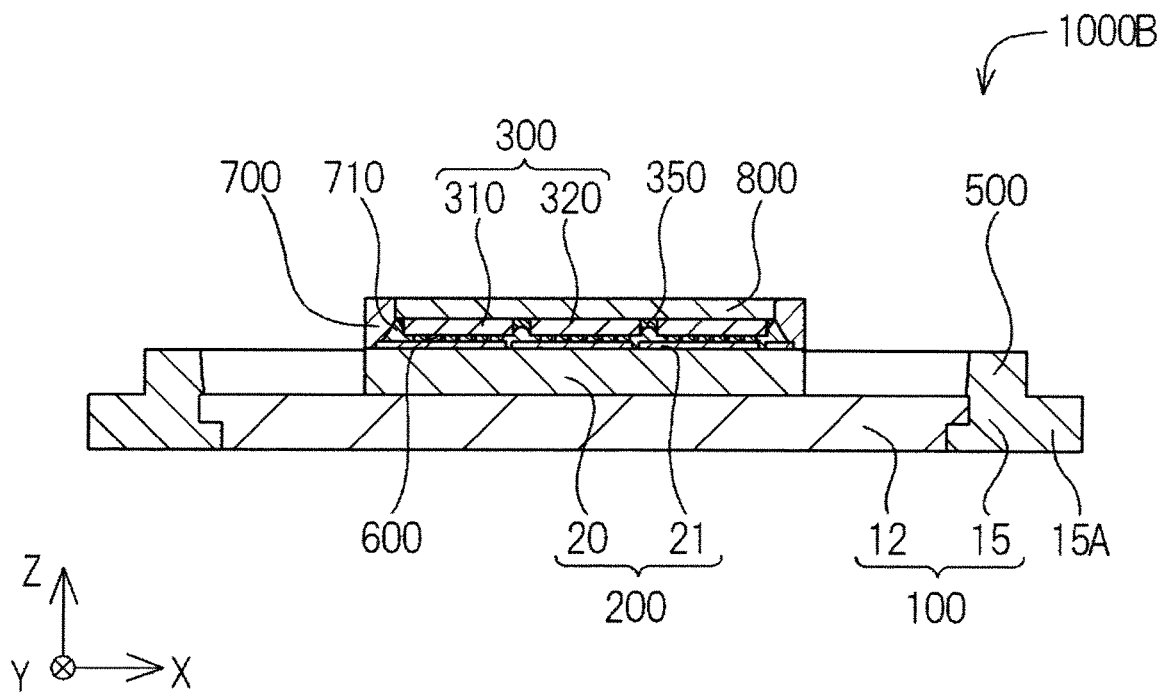
FIG. 4B is a schematic cross-sectional view taken along line IVB-IVB in FIG. 4A.
Figure 4C:
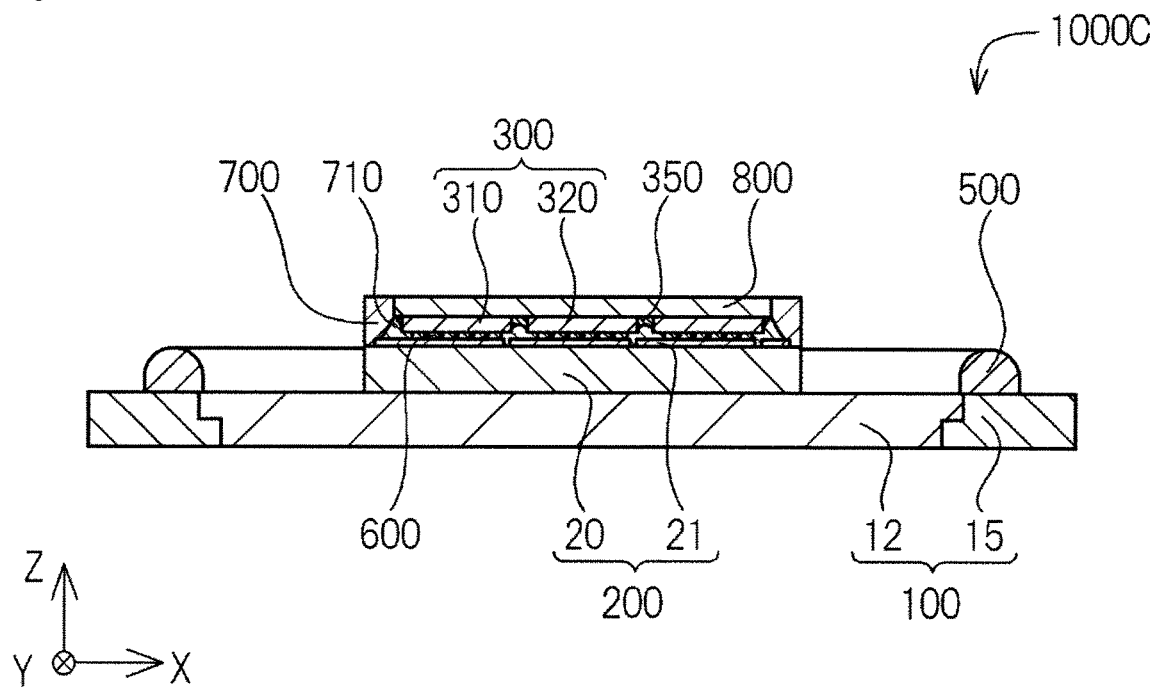
FIG. 4C is a schematic cross-sectional view of Variation 3 of the light emitting device according to the embodiment.

The wall part 500, which straddles and covers the upper face of the first lead 11 and the upper face of the second lead 12, and the resin part 15, which holds in place the first lead 11 and the second lead 12, can be formed of the same material as shown in FIG. 1C, or formed as individual parts as shown in FIG. 3. In the case in which the wall part 500 and the resin part 15 are formed of the same material, the wall part 500 is a part of the resin part 15. In the case in which the wall part 500 and the resin part 15 are formed of the same material, furthermore, the first substrate 100 has a wall part 500. In the case in which the wall part 500 and the resin part 15 are formed of the same material, the portion of the resin part 15 located in the +Z direction (upward) from a plane coplanar with the uppermost face of the second lead 12 in the Z direction (third direction) shown in FIG. 1C represents the wall part 500. The wall part 500 and the resin part 15 formed of the same material can readily reduce the occurrence of separation between the leads and the resin part. Even in the case in which the resin part 15 holding the first lead 11 and the second lead 12 in place and the wall part 500 are individual parts, the wall part 500 straddling and covering the upper faces of the first lead 11 and the second lead 12 can reduce the occurrence of separation between the leads and the resin part. Specifically, the wall part 500 disposed on the resin part 15 straddles and covers the upper face of the first lead 11 and the upper face of the second lead 12, and therefore the first lead 11 and the second lead 12 are held in place by the wall part 500. This can reduce the occurrence of deformation of the first lead 11 and/or the second lead 12 caused by heat or the like. This can result in reduction in the occurrence of separation between the leads and the resin part.

There is no particular restriction for the width W5 and the height H5 of the wall part 500 in a cross section, but the ratio of the height H5 to the width W5 of the wall part 500 (H5/W5) is preferably at least 0.2, but less than 1. A ratio of the height H5 to the width W5 of the wall part (H5/W5) of at least 0.2 in a cross section means that the height H5 of the wall part 500 can be large, thereby enhancing the strength of the wall part 500. A ratio of the height H5 to the width W5 of the wall part (H5/W5) of less than 1 in a cross section means that the width W5 of the wall part 500 can be large, thereby enhancing the strength of the wall part 500. In other words, the width W5 and/or the height H5 of the wall part 500 are preferably set so as not to excessively reduce the strength of the wall part 500. Making the width W5 and/or the height H5 of the wall part 500 too large in an attempt to increase the strength of the wall part 500 would allow the wall part 500 to readily block the light from the light emitting element. Accordingly, the width W5 and/or the height H5 of the wall part 500 are preferably set so as to make it difficult for the wall part 500 to block the light from the light emitting element while taking the strength of the wall part 500 into consideration. In the description herein, the width W5 of the wall part 500 is the shortest distance from the inner edge of the wall part 500 to the outer edge of the wall part 500 in the top view.

As shown in FIG. 1A and FIG. 1C, the outer lateral faces of the resin part 15 and the outer lateral faces of the wall part 500 can be coplanar. Making the outer lateral faces of the resin part 15 and the outer lateral faces of the wall part 500 coplanar can facilitate size reduction of the light emitting device. For example, in the case in which the outer lateral faces of the resin part 15 and the outer lateral faces of the wall part 500 are coplanar, the resin part 15 would not have the extended portion 15A extending from the outer edges of the wall part 500 described later in the top view. The outer lateral faces of the resin part 15 and the outer lateral faces of the wall part 500 being coplanar makes it easier to reduce the size of the light emitting device. As in the case of the light emitting device 1000B shown in FIG. 4A and FIG. 4B, the resin part 15 can have an extended portion 15A extending from the outer edges of the wall part 500 in the top view. The height of the extended part 15A is preferably smaller than the height of the wall part 500. Making the height of the extended part 15A smaller than the height of the wall part 500 can reduce the occurrence of the extended part 15A blocking the light from the light emitting element. For example, the upper face of the extended part 15A can be positioned to be coplanar with the upper face of the first lead 11 and the upper face of the second lead 12. In the case in which the resin part 15 has the extended part 15A, for example, the light emitting device can be handled by grasping the extended part 15A with tweezers. The light emitting element or the like is then less likely to touch the tweezers, thereby increasing the reliability of the light emitting device. In the case in which the resin part 15 and the wall part 500 are individual parts as in the case of the light emitting device 1000C shown in FIG. 4C, the resin part 15 having the extended part 15A extending from the outer edges of the wall part 500 makes it easier to form the wall part 500 on the resin part 15. For example, an uncured material for forming the wall part 500 is dripped or drawn on the resin part 15 and hardened to thereby form the wall part 500 on the resin part 15.

Figure 5:
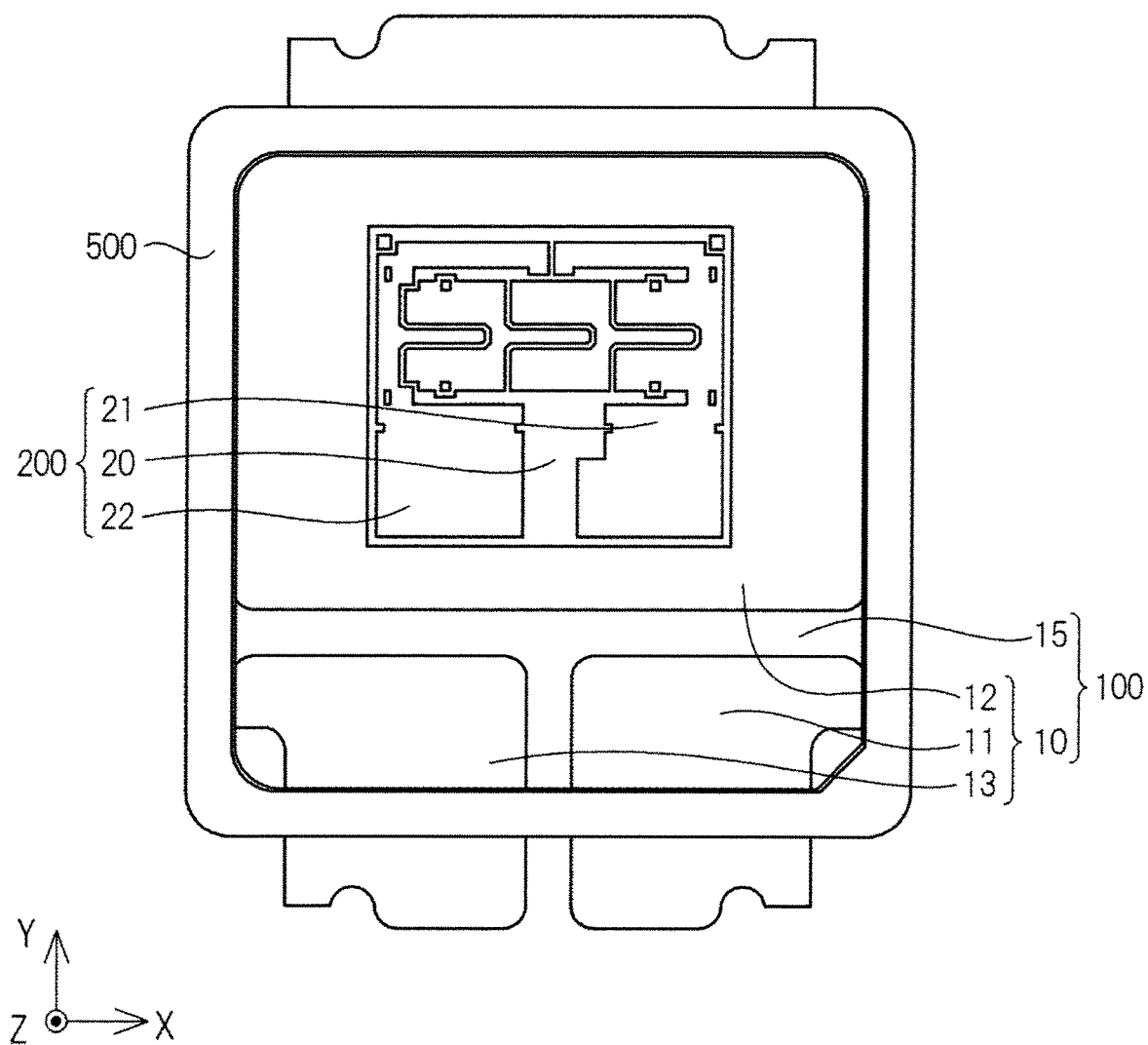
FIG. 5 is a schematic top view of the first substrate and the second substrate of the light emitting device according to the embodiment.
Figure 6:
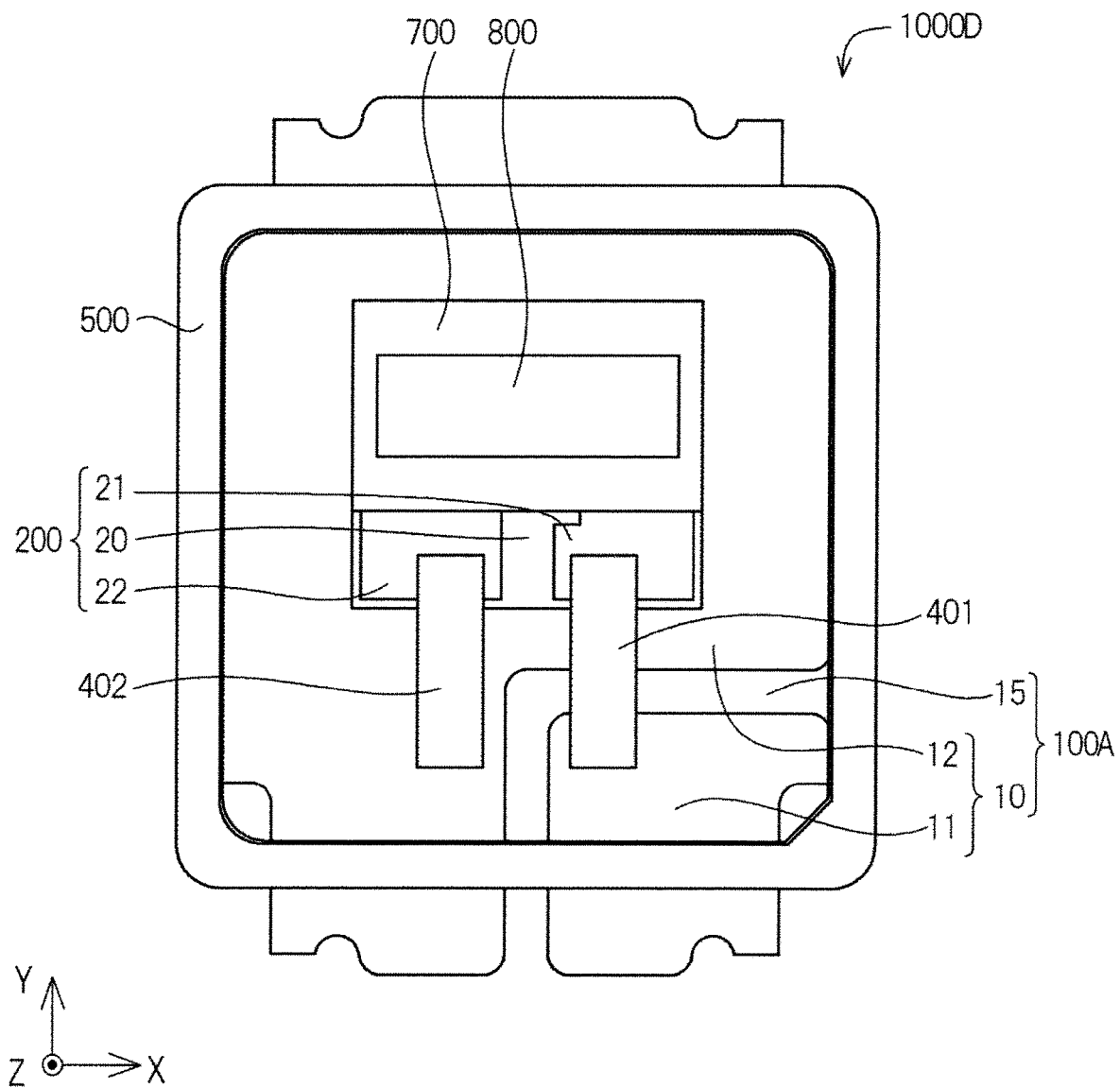
FIG. 6 is a schematic top view of Variation 4 of the light emitting device according to the embodiment.

As shown in FIG. 5, the second substrate 200 is disposed on the second lead 12. The second substrate 200 has a base 20, a first conducting part 21, and a second conducting part 22. The first conducting part 21 and/or the second conducting part 22 can be of a single layer or multiple layers stacked. The first conducting part 21 is positioned on the upper face of the base 20. The second conducting part 22 is positioned on the upper face of the base 20 positioned apart from the first conducting part 21. The first conducting part 21 and the second conducting part 22 are preferably arranged along the second direction (X direction). This can facilitate size reduction in the light emitting device 1000 in the first direction (Y direction). The second substrate 200 can be fixed to the second lead 12 by using a known adhesive material, such as an epoxy resin, silicone resin, or metal paste. Examples of metal paste include silver paste, aluminum paste, gold paste, and the like. The second substrate 200 is preferably fixed to the second lead 12 using silver paste. Because silver paste has higher thermal conductivity than aluminum paste, heat can be more readily transferred from the second substrate 200 to the second lead 12 in the case in which silver paste is used as the adhesive material. This can improve the heat dissipation performance of the light emitting device. Furthermore, because silver paste is less expensive than gold paste, the use of silver paste as the adhesive material can reduce the component costs of the light emitting device.

The upper face of the base 20 is preferably flat. The base 20 having a flat upper face can reduce the occurrence of the base 20 blocking the light of the light emitting element as compared to the case in which the base 20 has lateral walls surrounding the light emitting element. The base 20 having a flat upper face can thus improve the light extraction efficiency of the light emitting device 1000. In the description herein, being flat includes allowable variations of up to ±15 μm.

As shown in FIG. 1A, the light emitting device 1000 includes a first wire 401 and a second wire 402. The first wire 401 electrically connects the first lead 11 and the first conducting part 21. As in the case of the light emitting device 1000 shown in FIG. 1A, the second wire 402 can electrically connect the third lead 13 and the second conducting part 22. Alternatively, as in the case of the light emitting device 1000D shown in FIG. 6, the second wire 402 can electrically connect the second lead 12 and the second conducting part 22. The first wire 401 and the second wire 402 are preferably arranged along the second direction (X direction). This can facilitate size reduction in the light emitting device 1000 in the first direction (Y direction).

For the first wire 401 and the second wire 402, a known conductive wire can be used. The first wire 401 is preferably a ribbon wire. A ribbon wire is in the form of an elongated strip, and the cross-sectional shape is substantially rectangular. The strength of the first wire 401 can be more easily enhanced by using a ribbon wire as compared to the case of using a wire having a substantially circular cross section. For example, in the case in which the height of the first wire 401 is constant, the cross-sectional area of the first wire 401 can more readily be made larger if the cross-sectional shape is substantially rectangular than in the case of a substantially circular cross section. Because the cross-sectional area of the first wire 401 can be made larger, the use of a ribbon wire for the first wire 401 can more readily enhance the strength of the first wire 401. In the case in which the cross-sectional area of the first wire 401 is constant, one having a substantially rectangular cross section can make it easier to reduce the height of the first wire 401 than one having a substantially circular cross-sectional shape. This makes it easier to reduce the occurrence of the first wire 401 blocking the light from the light emitting element. The short sides of the substantially rectangular cross section of the first wire extends along the third direction (Z direction). In the description herein, extending along the third direction includes allowable variations of up to ±5°. Similarly, the second wire 402 is preferably a ribbon wire. For example, a ribbon wire having the length of a long side in a cross section of in a range of 0.5 mm to 1 mm, and the length of a short side of in a range of 0.05 mm to 0.3 mm can be used as the first wire 401 and/or the second wire 402.

The first wire 401 and/or the second wire 402, for example, can contain aluminum. In the case in which the first wire 401 contains aluminum, the outermost surface of the first conducting part 21 preferably contains aluminum. The first wire 401 and the first conducting part 21 containing the same type of metal can reduce galvanic corrosion, to thereby improve the reliability of the light emitting device. The outermost surface of the first conducting part 21 containing aluminum means that the first conducting part 21 contains aluminum in the case in which the first conducting part 21 is of a single layer, and the layer at the outermost surface of the first conducting par 21 contains aluminum in the case in which the first conducting part 21 is of a stack of multiple layers. Similarly, in the case in which the second wire 402 contains aluminum, the outermost surface of the second conducting part 22 preferably contains aluminum.

At least one light emitting element 300 is disposed on the second substrate 200. The light emitting element 300 is electrically connected to the first conducting part 21. The light emitting element 300 is also electrically connected to the second conducting part 22. The light emitting element 300 has a first face having at least a pair of positive and negative electrodes, a second face located opposite the first face, and third faces located between the first face and the second face. The light emitting element 300 can be disposed on the second substrate 200 such that the first face faces the second substrate 200, or such that the second face faces the second substrate 200. The light emitting element 300 is preferably disposed on the second substrate 200 such that the first face faces the second substrate 200. The light from the light emitting element 300 is primarily extracted from the light emitting device 1000 in the +Z direction. Facing the first face having the positive and negative electrodes to the second substrate 200 can reduce the occurrence of the positive and negative electrodes blocking the outgoing light from the light emitting element in the +Z direction. This can improve the light extraction efficiency of the light emitting device. The face of the light emitting element 300 that faces the second substrate 200 may occasionally be referred to as the lower face of the light emitting element 300, and the face of the light emitting element 300 located opposite the lower face as the upper face of the light emitting element. The faces located between the upper face and the lower face of the light emitting element may be referred to as the lateral faces of the light emitting element. For example, in the case of disposing the light emitting element 300 on the second substrate 200 so as to face the first face of the light emitting element 300 to the second substrate 200, the first face of the light emitting element 300 may be referred to as the lower face of the light emitting element 300, and the second face as the upper face of the light emitting element 300.

In the case in which the first face having the positive and negative electrodes faces the second substrate 200, the light emitting element 300 and the first conducting part 21 are electrically connected by using a known conductive bonding member 600, such as metal bumps or solder. In the case in which the second face of the light emitting element 300 faces the second substrate 200, the light emitting element 300 can be secured to the second substrate 200 by using a known bonding material, such as a silicone resin or epoxy resin. In the case in which the second face of the light emitting element 300 faces the second substrate 200, the light emitting element 300 and the first conducting part 21 are electrically connected by using a wire or the like.

Figure 7A:
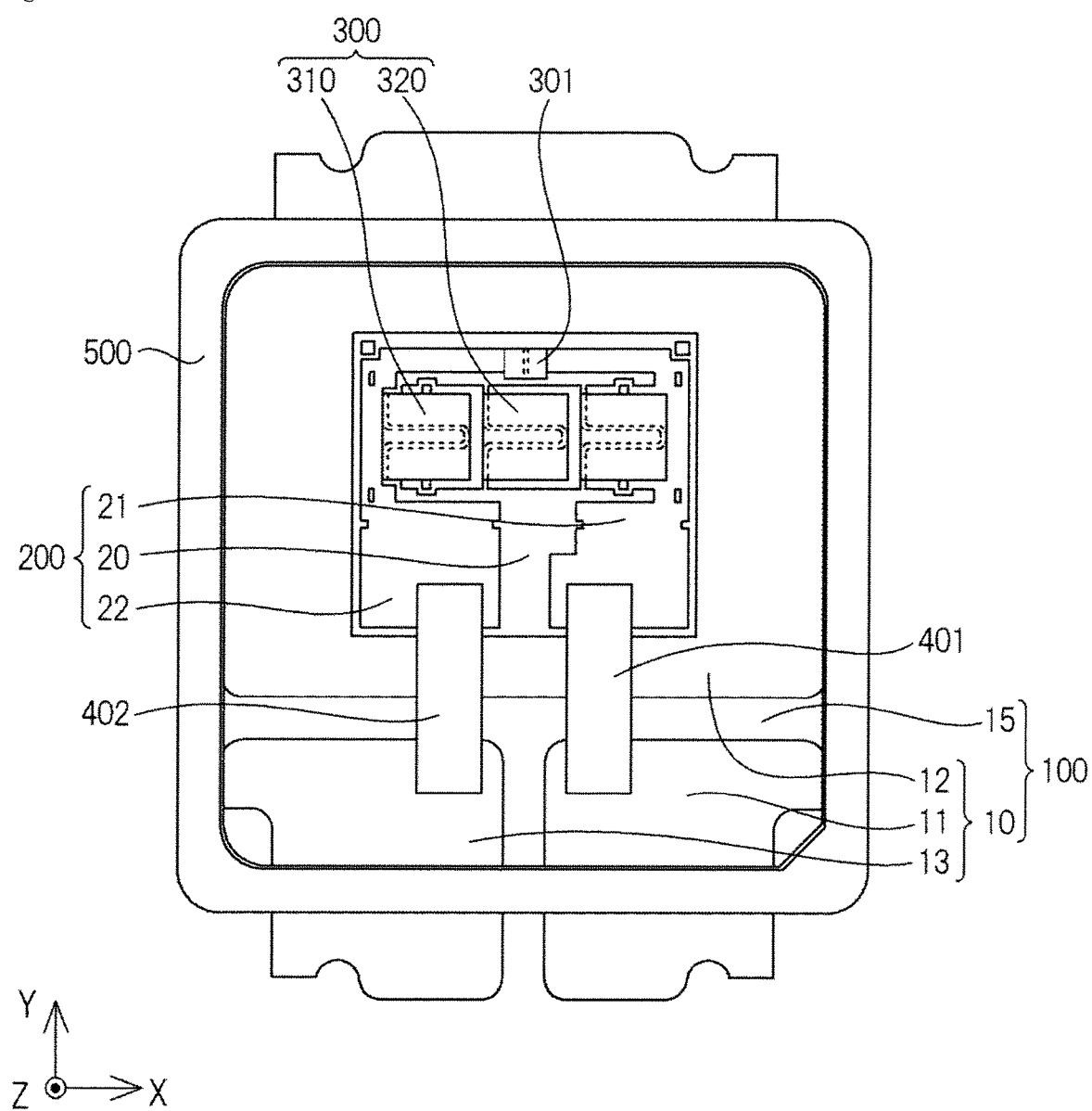
FIG. 7A is a schematic top view showing the first substrate, the second substrate, the first wire, the second wire, the light emitting element, and the protective device in the light emitting device according to the embodiment.
Figure 7B:
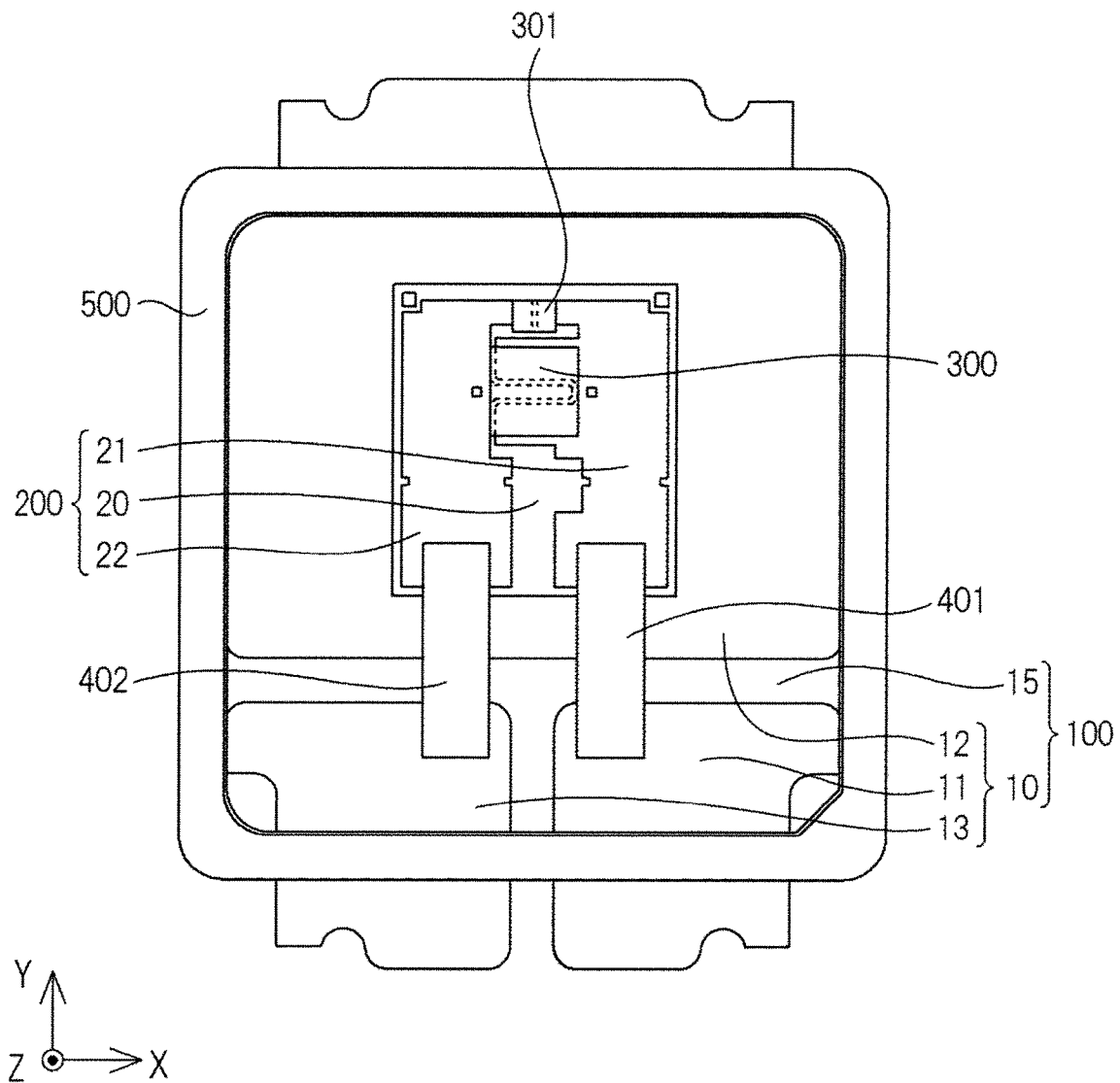
FIG. 7B is a schematic top view showing the first substrate, the second substrate, the first wire, the second wire, the light emitting elements, and the protective device in Variation 5 of the light emitting device according to the embodiment.
Figure 7C:
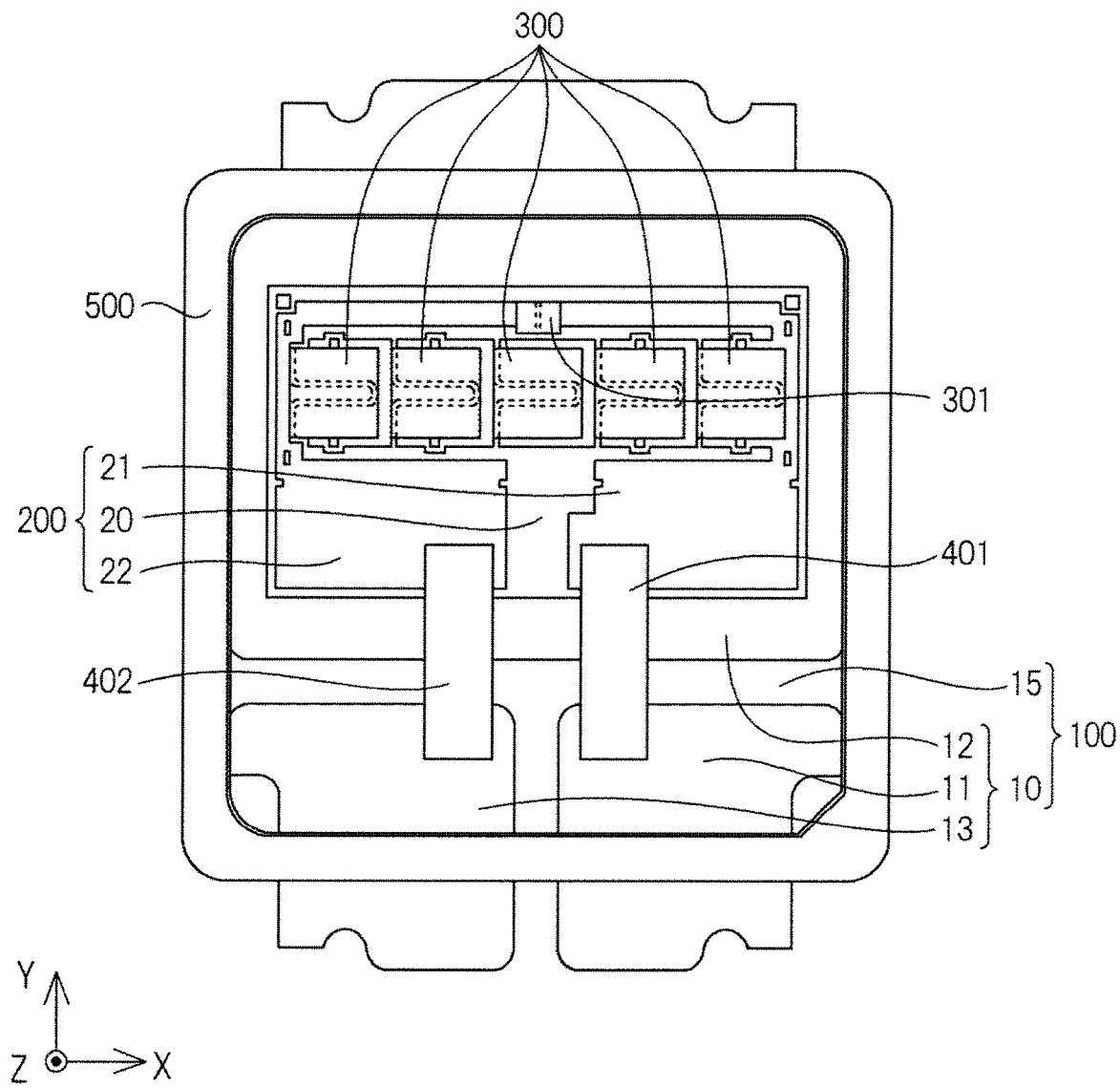
FIG. 7C is a schematic top view showing the first substrate, the second substrate, the first wire, the second wire, the light emitting element, and the protective device in Variation 6 of the light emitting device according to the embodiment.

The number of light emitting elements 300 can be one or more, for example, three as shown in FIG. 7A, one as shown in FIG. 7B, or five as shown in FIG. 7C.

Some parts of the outer edges of the light emitting element 300 preferably extend along the second direction (X direction). This can facilitate size reduction in the light emitting device 1000 in the first direction (Y direction). In the description herein, extending along the second direction includes allowable variations of up to ±5°. In the case in which the light emitting device 1000 includes a plurality of light emitting elements 300, as shown in FIG. 7A, a first light emitting element 310 and a second light emitting element 320 adjacent to each other are preferably arranged along the second direction (X direction). This can facilitate size reduction in the light emitting device 1000 in the first direction (Y direction). The light emitting elements 300 include a first light emitting element 310 and a second light emitting element 320. It is preferable for parts of the outer edges of the first light emitting element 310 and the second light emitting element 320 to extend in the second direction (X direction), and for the parts of the outer edges of the first light emitting element 310 and the second light emitting element 320 extending along the second direction (X direction) to be collinear. This can facilitate size reduction in the light emitting device 1000 in the first direction (Y direction). In the description herein, being collinear includes allowable variations of up to ±5°.

As shown in FIG. 7A, FIG. 7B, and FIG. 7C, a protective device 301 can be disposed on the second substrate 200. The protective device 301 is connected in parallel to at least one light emitting element 300. Providing the light emitting device with a protective device 301 can increase the electrostatic breakdown voltage of the light emitting device.

Figure 7D:
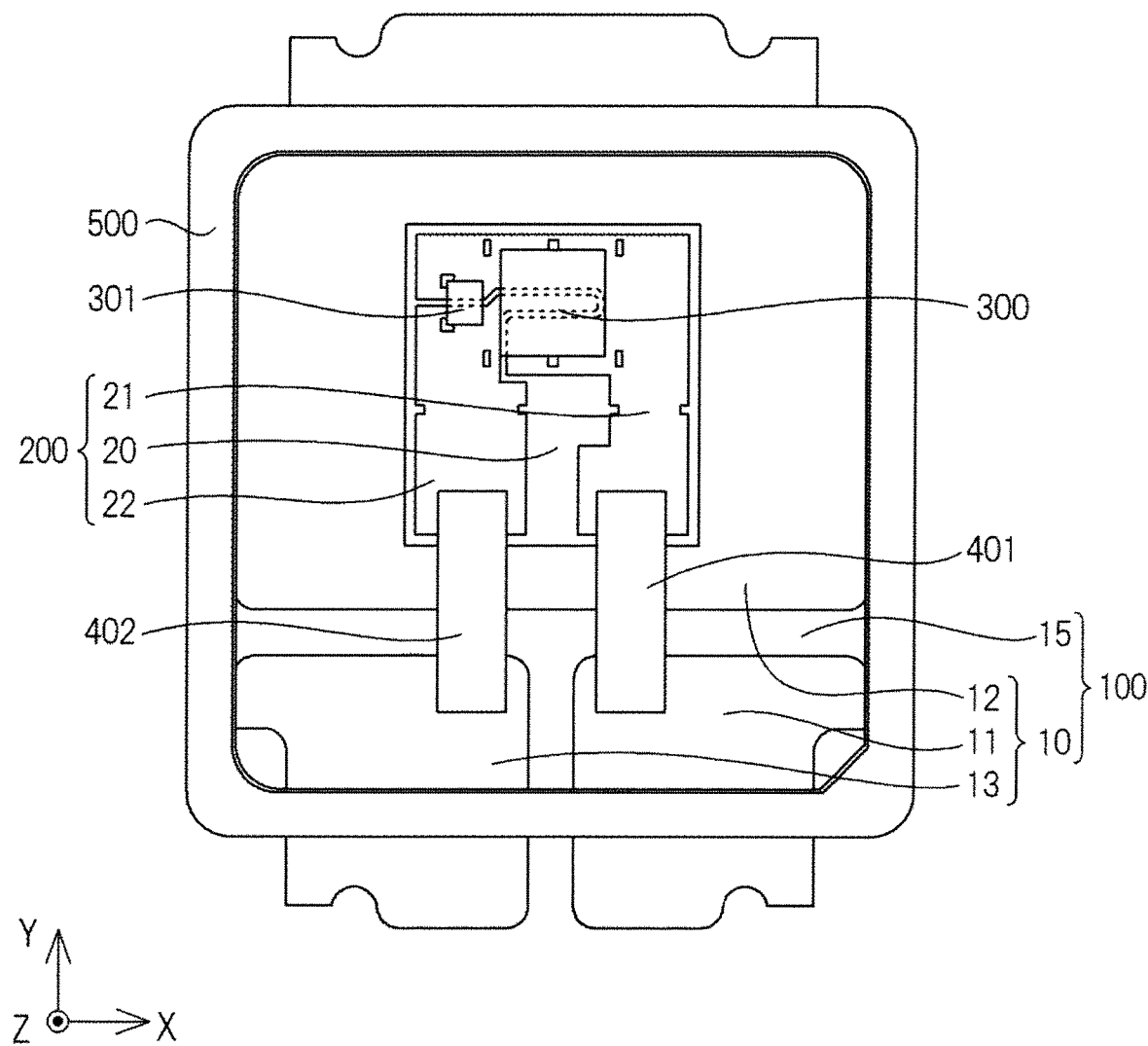
FIG. 7D is a schematic top view showing the first substrate, the second substrate, the first wire, the second wire, the light emitting element, and the protective device in Variation 6A of the light emitting device according to the embodiment.

The light emitting elements 300 and the protective device 301 can be arranged in the first direction (Y direction) as shown in FIG. 7A, or in the second direction (X direction) as shown in FIG. 7D. The light emitting elements 300 and the protective device 301 arranged in the first direction (Y direction) can facilitate size reduction in the light emitting device in the second direction (X direction). The light emitting elements 300 and the protective device 301 arranged in the second direction (X direction) can facilitate size reduction in the light emitting device in the first direction (Y direction).

As shown in FIG. 1B and FIG. 1C, the light emitting device 1000 preferably includes a reflecting member 700 covering the lateral faces of a light emitting element 300. This allows the reflecting member 700 to reflect the light from the light emitting element 300, thereby reducing the possibility that the first wire and/or the second wire will block the light from the light emitting element. Allowing the first wire and/or the second wire to block the light from the light emitting element may make the luminous intensity distribution non-uniform. Allowing the reflecting member 700 to reflect the light from the light emitting element can make it easy to design a desired luminous intensity distribution. Furthermore, covering the lateral faces of the light emitting element 300 with the reflecting member 700 can protect the light emitting element 300 from external forces. In the case in which the light emitting device includes a protective device, the protective device is preferably covered by the reflecting member at least in part. This can reduce the occurrence of the protective device from absorbing the light from the light emitting element.

The reflecting member 700 preferably entirely covers the lateral faces of the light emitting element 300. This can further reduce the occurrence of the first wire and/or the second wire blocking the light from the light emitting elements. Even in the case in which the lateral faces of the light emitting element 300 are covered by the reflecting member 700, a portion of the light from the light emitting element may transmit through the reflecting member 700. Accordingly, making the height H5 of the wall part 500 lower than the height H2 of the second substrate 200 can improve the light extraction efficiency of the light emitting device.

In the case in which there are multiple light emitting elements 300, it is preferable for a single reflecting member 700 to cover the lateral faces of the multiple light emitting elements. In other words, the lateral faces of the multiple light emitting elements are covered by using a single reflecting member. This can facilitate size reduction in the light emitting device as compared to the case in which the lateral faces of the light emitting elements are individually covered by separate reflecting members.

As shown in FIG. 1B, the reflecting member 700 is preferably positioned apart from the first wire 401. This can reduce the occurrence of the reflecting member 700 applying force to the first wire 401 even when the reflecting member 700 expands and/or contracts in response to temperature fluctuations. This can reduce the occurrence of the deformation of the first wire 401. Similarly, the reflecting member 700 is preferably positioned apart from the second wire 402.

The reflecting member 700 covering the lateral faces of a light emitting element can be positioned between the lower face of the light emitting element 300 and the upper face of the second substrate 200. This can reduce the occurrence of the second substrate absorbing the light from the light emitting element. As shown in FIG. 1B, an underfill 710 can be disposed between the lower face of the light emitting element 300 and the upper face of the second substrate. By forming the reflecting member 700 that covers the lateral faces of the light emitting element 300 and the underfill 710 that covers the lower face of the light emitting element using individual materials, in the case in which the base materials for the reflecting member 700 and the underfill 710 are thermosetting resins, the viscosity of the uncured base material for the underfill 710 can be made lower than the viscosity of the uncured base material for the light reflecting member 700. This can facilitate provision of the underfill 710 to the space between the lower face of the light emitting element 300 and the upper face of the second substrate.

In the case in which the reflecting member 700 and/or the underfill 710 are/is present between the lower face of the light emitting element 300 and the upper face of the second substrate, metal bumps are preferably used as the bonding members 600. This can increase the distance between the lower face of the light emitting element 300 and the upper face of the second substrate. This can allow the reflecting member 700 and/or the underfill 710 to be provided to the space between the lower face of the light emitting element 300 and the upper face of the second substrate.

As shown in FIG. 1B, the light emitting device 1000 preferably includes a light transmissive member 800 that covers the upper face of the light emitting element 300. This can protect the light emitting element 300 from external forces. The light transmissive member 800 can contain wavelength conversion particles. This can facilitate the adjustment of the emission color of the light emitting device 1000. Wavelength conversion particles absorb at least a portion of the primary light emitted by a light emitting element and emit secondary light having a different wavelength from that of the primary light. By including wavelength conversion particles in the light transmissive member, the light emitting device 1000 can emit mixed-color light that is a mixture of the primary light from the light emitting element and the secondary light emitted by the wavelength conversion particles. For example, using a blue LED for the light emitting element and a phosphor such as YAG for the wavelength conversion particles can construct a light emitting device that outputs white light made by mixing the blue light from the blue LED and the yellow light emitted by the phosphor after being excited by the blue light.

The light transmissive member 800 can cover the upper face of the light emitting element 300 via a light guide member 350. The light guide member 350 preferably covers the lateral faces of the light emitting element 300. This can enhance the bonding strength between the light guide member 350 and the light emitting element 300. In the case in which the light emitting device 1000 includes a reflecting member 700 that covers the lateral faces of the light emitting element 300, the reflecting member 700 preferably covers the lateral faces of the light emitting element via the light guide member 350. The light guide member 350 has a higher transmittance relative to the light from the light emitting element 300 than that of the light reflecting member 700. Covering the lateral faces of the light emitting element 300 with the light guide member 350 facilitates guiding of light from the lateral faces of the light emitting element 300 through the light guide member 350 to the light transmissive member 800. This can improve the light extraction efficiency of the light emitting device.

In the case in which the light emitting device includes multiple light emitting elements, it is preferable for a single light guide member 350 to cover the lateral faces of the multiple light emitting elements. For example, as shown in FIG. 1C, a single light guide member 350 preferably covers the lateral faces of the first light emitting element 310 and the second light emitting element 320. Because the light from the first light emitting element 310 and the light from the second light emitting element 320 are guided by a single light guide member 350, luminance non-uniformity between the first light emitting element 310 and the second light emitting element 320 can be reduced.

A single light transmissive member can cover the upper face of a single light emitting element, or a single light transmissive member can cover the upper faces of multiple light emitting elements. In the case in which the light emitting device includes multiple light emitting elements, a single light transmissive member 800 preferably covers the upper faces of the multiple light emitting elements 300. For example, as shown in FIG. 1C, a single light transmissive member 800 preferably covers the upper face of the first light emitting element 310 and the upper face of the second light emitting element 320. Because the light from the first light emitting element 310 and the light from the second light emitting element 320 are guided to a single light transmissive member 800, luminance non-uniformity between the first light emitting element 310 and the second light emitting element 320 can be reduced.

Figure 8A:
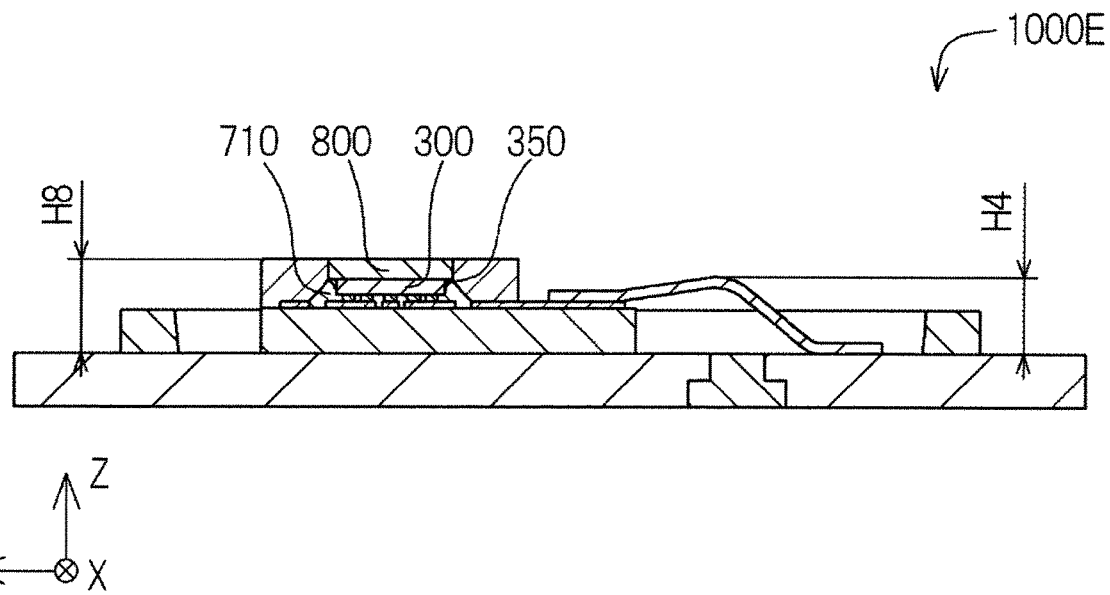
FIG. 8A is a schematic cross-sectional view of Variation 7 of the light emitting device according to the embodiment.

The height H8 of the light transmissive member 800 can be larger than the height H4 of the first wire 401 as in the case of the light emitting device 1000E shown in FIG. 8A. Alternatively, the height of the light transmissive member 800 can be smaller than the height of the first wire 401 as in the case of the light emitting device 1000 shown in FIG. 1B. The height H8 of the light transmissive member 800 is preferably larger than the height H4 of the first wire 401. Making the height H8 of the light transmissive member 800 larger than the height H4 of the first wire 401 can reduce the occurrence of the first wire 401 blocking the outgoing light from the light transmissive member 800. Similarly, the height of the light transmissive member 800 is preferably larger than the height of the second wire 402.

Figure 8B:
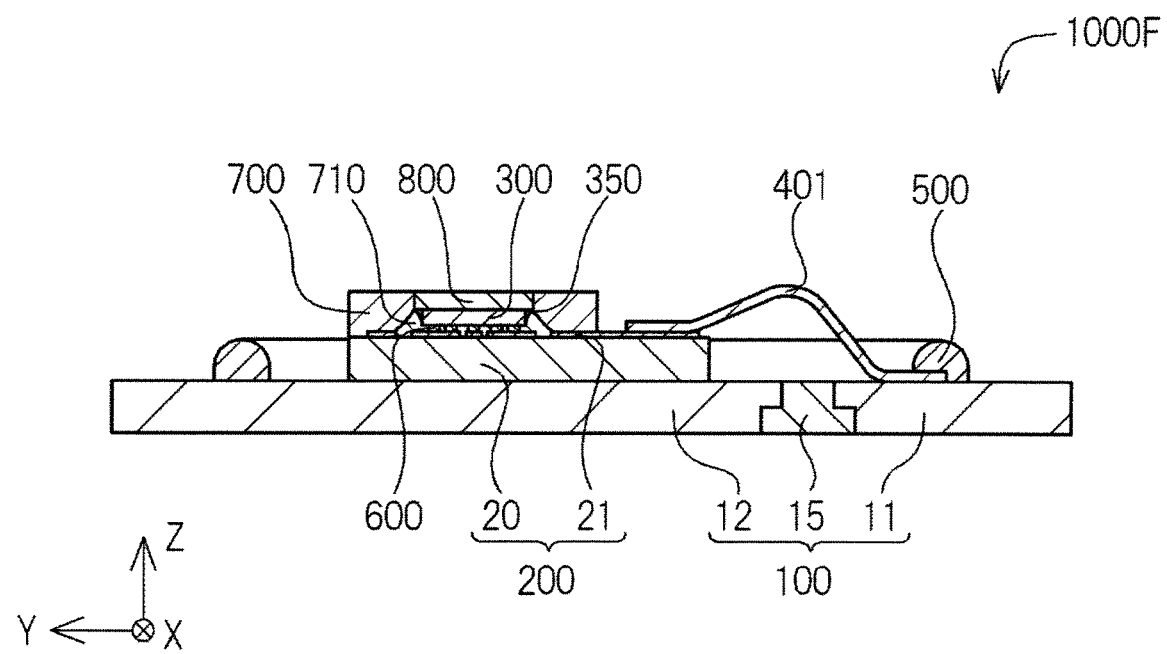
FIG. 8B is a schematic cross-sectional view of Variation 8 of the light emitting device according to the embodiment.

As in the case of the light emitting device 1000F shown in FIG. 8B, in the case in which the wall part 500 and the resin part 15 are individual parts, a portion of the first wire 401 is preferably covered by the wall part 500. This can facilitate size reduction in the light emitting device. In the case in which the wall part 500 and the resin part 15 are individual parts, moreover, the joint between the first wire 401 and the first lead 11 is preferably covered by the wall part 500. This can reduce the occurrence of separation between the first lead 11 and the first wire 401.

Figure 8C:
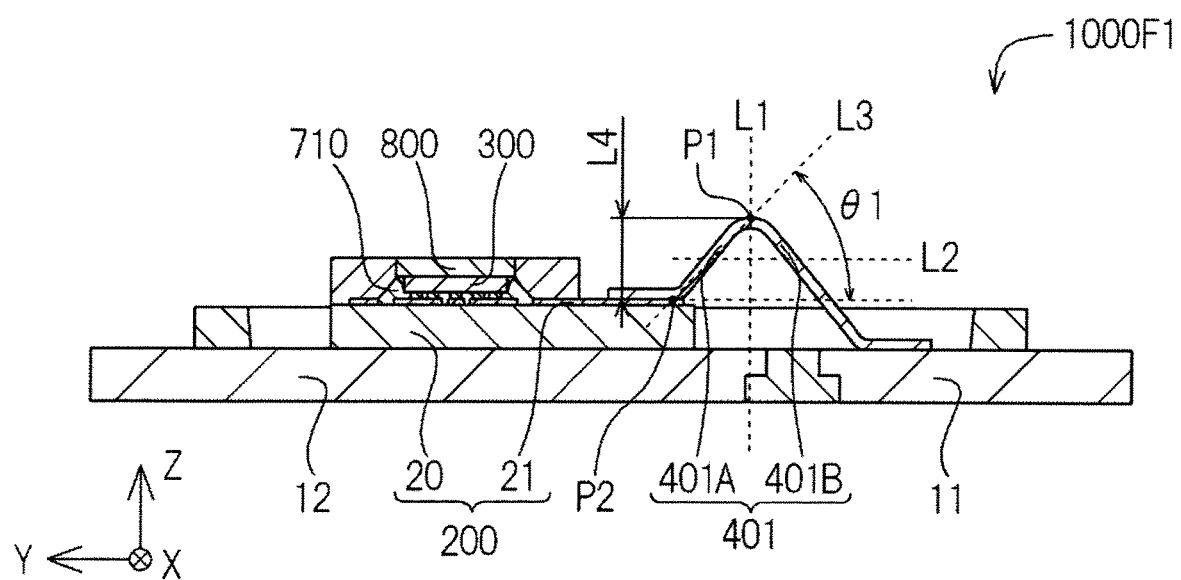
FIG. 8C is a schematic cross-sectional view of Variation 8A of the light emitting device according to the embodiment.

As in the case of the light emitting device 1000F1 shown in FIG. 8C, the first wire 401 has a first part 401A configuring from the portion connected to the first conducting part 21 to the first point P1 that is the peak of the first wire 401, and a second part 401B configuring from the portion connected to the first lead 11 to the first point P1. The first part 401A includes the portion connected to the first conducting part 21, and the second part 401B includes the portion connected to the first lead 11. When viewed in the second direction (X direction), one portion of the first part 401A and one portion of the second part 401B preferably have line symmetry using the line L1 passing the first point P1 and parallel to the third direction (Z direction) as the symmetric axis. Particularly, when viewed in the second direction (X direction), the portion of the first part 401A located in the upper half section of the first part 401A and the portion of the second part 401B located in the upper half section of the second part 401B have line symmetry using the line L1 as the line of symmetry. The upper half section of the first part 401A is the region positioned in the +Z direction (upward) from the line L2 which passes the point in the first part 401A at one half of the height L4 and extends in the first direction (Y direction). This makes it easier to prevent the first wire 401 from deforming. For example, if a downward force is applied to the first point P1 of the first wire 401, because a portion of the first part 401A and a portion of the second part 401B have line symmetry using the line L1 as the symmetric axis, the amount of force applied to the first part 401A and the amount of force applied to the second 401B tend to be nearly equal. This can more effectively suppress the first wire 401 from deforming than in the case in which different amounts of force are applied to the first part 401A and the second part 401B.

As shown in FIG. 8C, when viewed in the second direction (X direction), in the portion where the first wire 401 and the first conducting part 21 are connected, the point that is closest to the first lead 11 is designated as the point P2. A line connecting the first point P1 and the second point P2 referred to as a line L3. When viewed in the second direction (X direction), the angle θ1 formed by the line L3 and the first direction (Y direction) is preferably 0° to 60°, more preferably 5° to 40°. A small angle θ1 can readily reduce the height of the first wire 401. This can easily reduce the occurrence of the first wire 401 blocking the light from the light emitting element 300. A large angle θ1 can readily increase the length of the first wire 401. This can suppress the first wire 401 from breaking even if heat causes the first lead 11 and the second lead 12 to expand or contract. The angle θ1 represents the acute angle between the acute and obtuse angles formed by the line L3 and the first direction (Y direction).

Figure 9A:
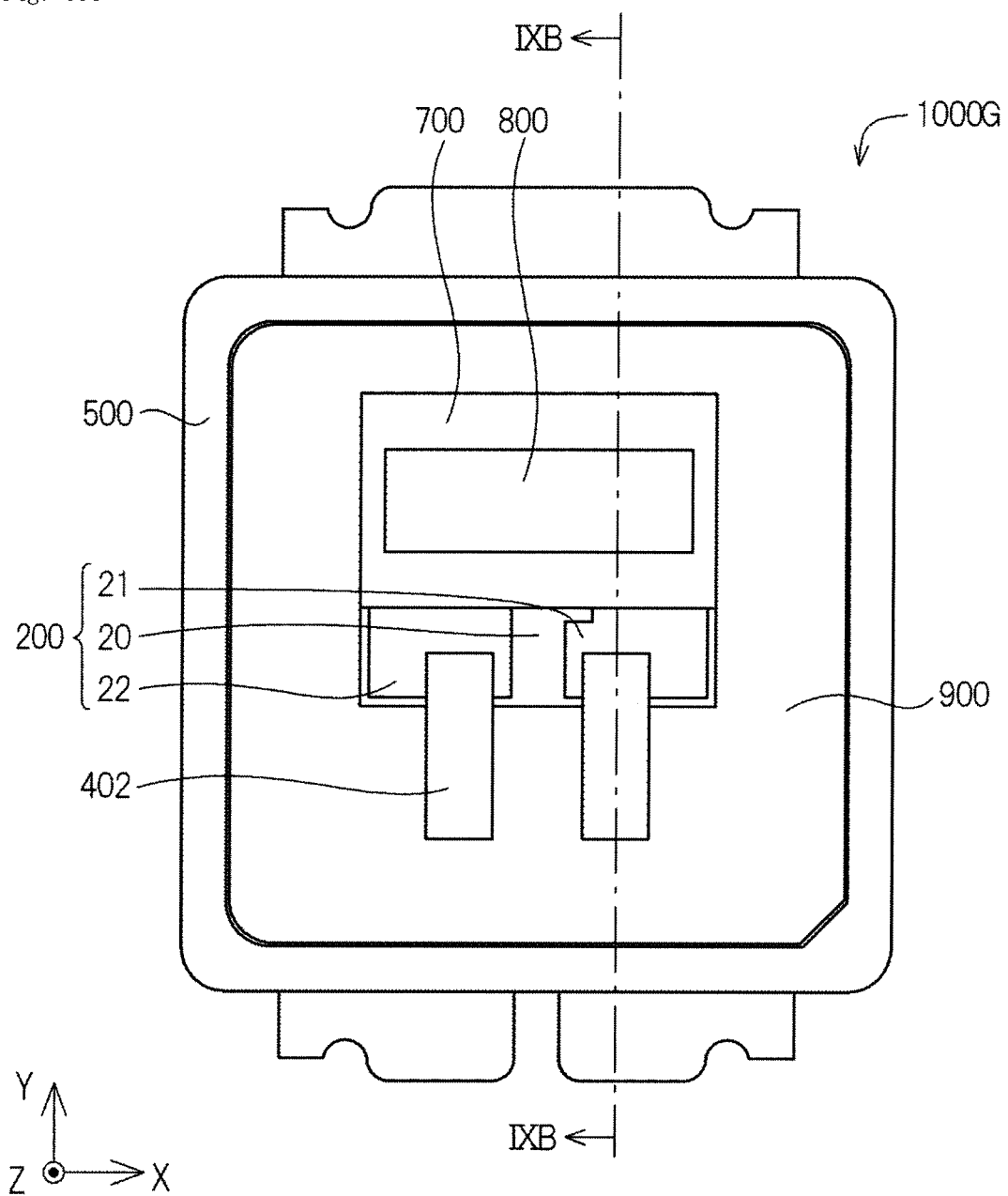
FIG. 9A is a schematic top view of Variation 9 of the light emitting device according to the embodiment.
Figure 9B:
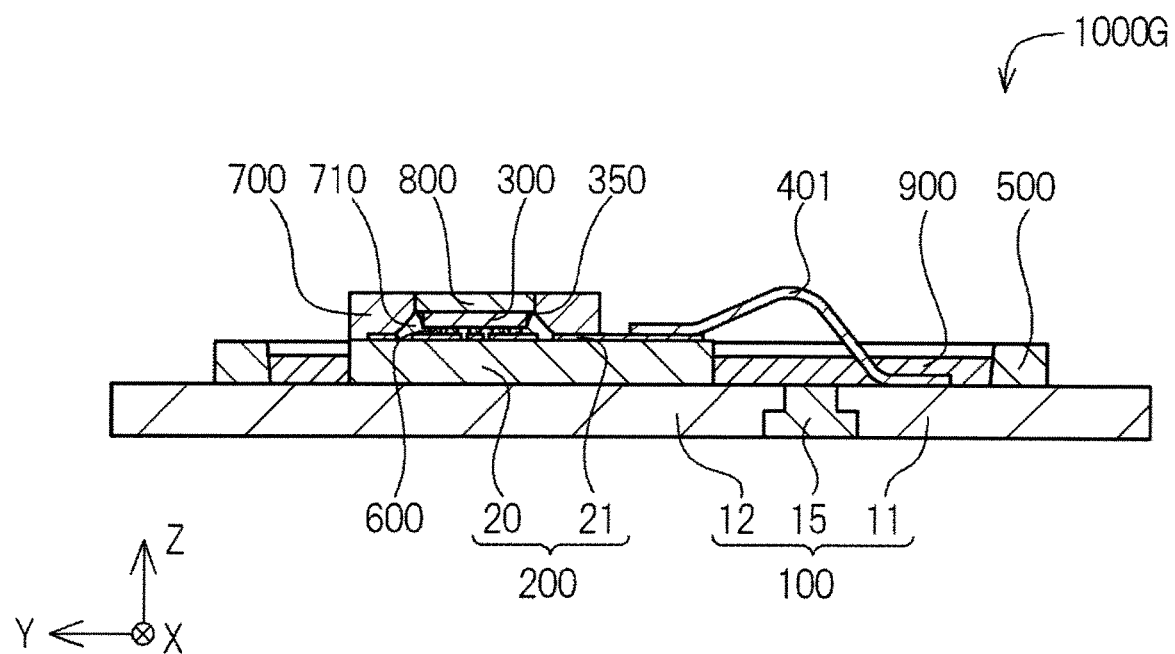
FIG. 9B is a schematic cross-sectional view taken along IXB-IXB in FIG. 9A.

As in the case of the light emitting device 1000G shown in FIG. 9A and FIG. 9B, a cover member 900 covering the first lead 11 and the first wire 401 can be included. The cover member 900 covering the first lead 11 and the first wire 401 can protect the first lead 11 and/or the first wire 401 from moisture, external forces, or the like. Particularly, the cover member 900 preferably covers the joint between the first lead 11 and the first wire 401. This can reduce the occurrence of separation between the first lead 11 and the first wire 401. The cover member 900 preferably covers the first lead 11, the second lead 12, the first wire 401, and the second wire 402. This can protect the first lead 11, the second lead 12, the first wire 401, and the second wire 402 from moisture, external forces, or the like.

A portion of the first wire 401 can be exposed from the cover member 900, or the first wire 401 can be unexposed from the cover member 900. It is preferable for a portion of the first wire 401 to be exposed from the cover member 900. This can reduce the volume of the cover member 900, thereby reducing the possibility that the cover member 900 will block a portion of the light from the light emitting element. Even when the cover member 900 is a light transmissive member, a portion of the light from the light emitting element is absorbed by the cover member 900. Accordingly, exposing a portion of the first wire 401 from the cover member 900 can increase the light extraction efficiency of the light emitting device. Furthermore, a portion of the first wire 401 is preferably externally exposed. This can eliminate a need to dispose any member to cover the first wire 401 so as not to externally expose the first wire 401 entirely, thereby reducing the occurrence of blocking the light from the light emitting element. This can improve the light extraction efficiency of the light emitting device.

Figure 10A:
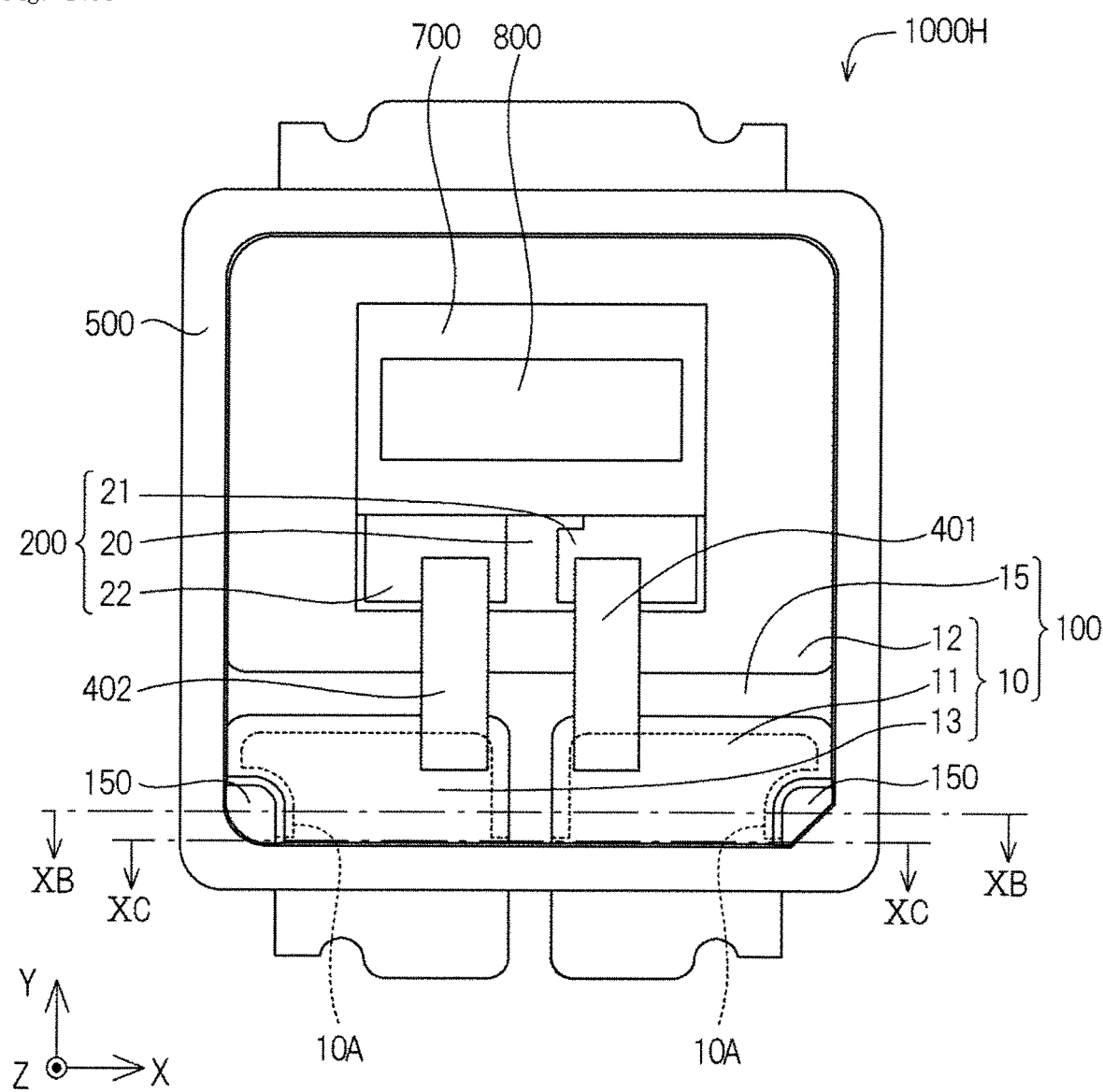
FIG. 10A is a schematic top view of Variation 10 of the light emitting device according to the embodiment.
Figure 10B:
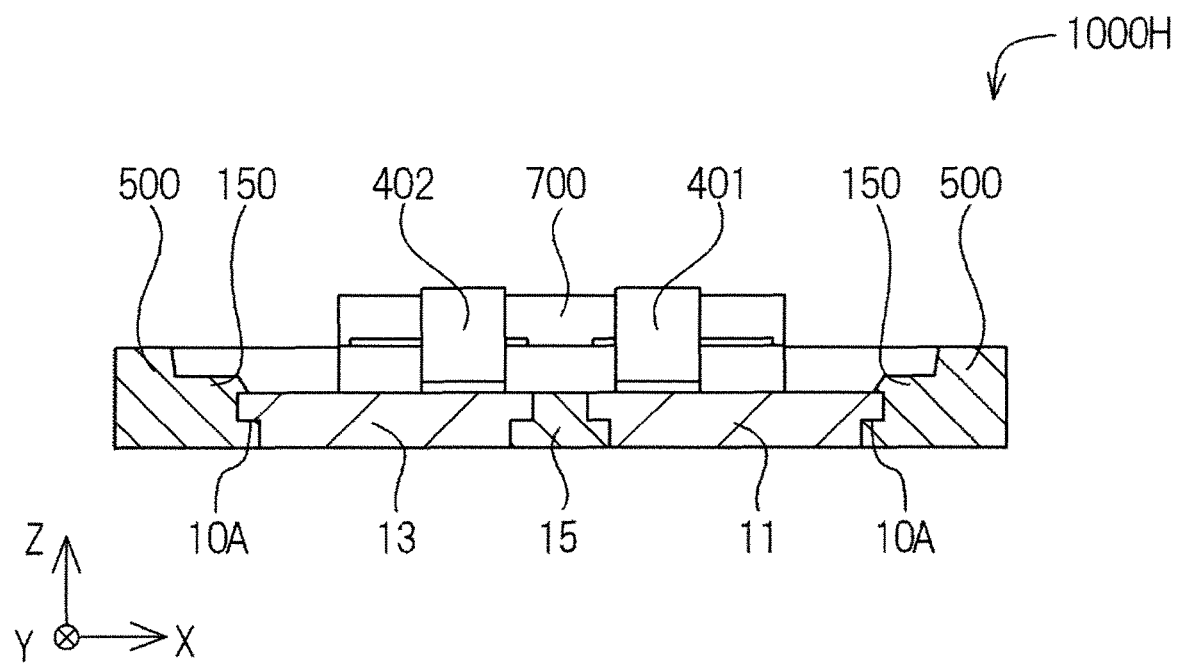
FIG. 10B is a schematic cross-sectional view taken along XB-XB in FIG. 10A.
Figure 10C:
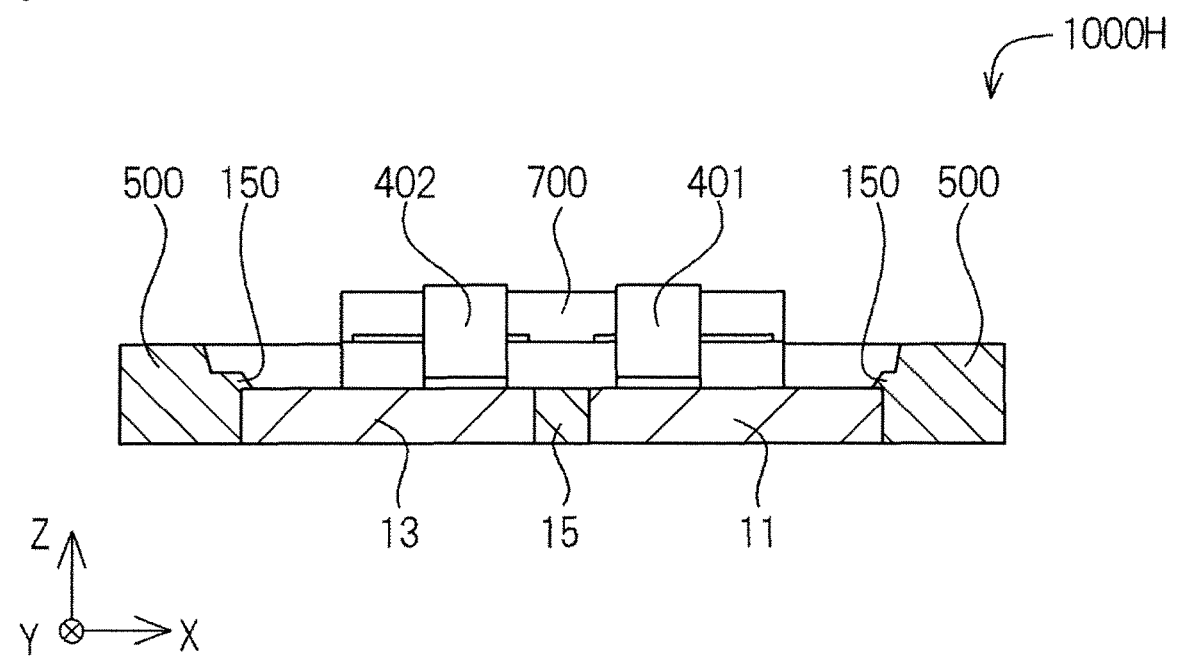
FIG. 10C is a schematic cross-sectional view taken along XC-XC in FIG. 10A.

As shown in FIG. 10A, FIG. 10B, and FIG. 10C, the resin part 15 can include a cover resin part 150 surrounded by the wall part 500 in a top view and covering the upper face of the first lead 11. The cover resin part 150 covering the upper face of the first lead 11 can improve the adhesion between the resin part 15 and the first lead 11. The cover resin part 150 is the portion of the resin part 15 surrounded by the wall part 500 in a top view and located in the +Z direction (upward) from the upper face of the first lead 11. The height of the cover resin part 150 is preferably lower than the height of the wall part 500. The height of the cover resin part 150 being smaller than the height of the wall part 500 can facilitate size reduction in the light emitting device 1000H in the third direction (Z direction). The resin part 15 of the light emitting device 1000H is formed of the same material as a material of the wall part 500 formed of the same material. The resin part 15 of the light emitting device 1000H includes the wall part 500 and the cover resin part 150. The cover resin part 150 preferably extends from the inner lateral face of the wall part 500. This can easily increase the area of the cover resin part 150 covering the upper face of the first lead 11. In the case in which the resin part 15 and the wall part 500 are formed of the same material, extending the cover resin part 150 from the inner lateral face of the wall part 500 can enhance the strength of the resin part 15 because the wall part 500 and the cover resin part 150 are connected. This can suppress the wall part 500 and/or the cover resin part 150 from cracking. In the case in which the resin part 15 and the wall part 500 are formed of the same material, and the inner lateral face of the wall part 500 is substantially quadrilateral-shaped in a plan view, the cover resin part 150 preferably extends from at least one corner part of the inner lateral face. This can enhance the strength of the corner part of the wall part 500, thereby suppressing the wall part 500 from cracking. In the description herein, a substantially quadrilateral shape can simply have two opposing sides that are in parallel and the other two opposing sides that are in parallel, including not only one having right angled corners, but also shapes having rounded corners, in which two orthogonal sides are linked by a curved line, shapes having chamfered corners, in which two orthogonal sides are linked by a straight line, and the like. A corner part of the inner lateral face of the wall part 500, in the case of a shape having rounded corners, include a line linking two orthogonal sides. Similarly, the resin part 15 can be surrounded by the wall part 500 in a plan view and include a cover resin part 150 covering the upper face of the second lead 12 and/or the upper face of the third lead 13. For example, as shown in FIG. 10A, the cover resin part 150 covering the upper face of the third lead 13 extends from a corner part of the wall part 500 which is substantially quadrilateral-shaped in a plan view.

As shown in FIG. 10B, the first lead 11 can have a recessed part 10A at the lower face. The recessed part 10A is recessed in the +Z direction. The recessed part 10A can be formed by a known method, such as pressing, half-etching, or the like. The recessed part 10A is covered by the resin part 15. This can enhance the adhesion between the first lead 11 and the resin part 15. As shown in FIG. 10B, in a cross-sectional view, the upper face of the first lead 11 is preferably covered by the cover resin part 150, and the recessed part 10A is covered by the resin part 15. This can enhance the adhesion between the first lead 11 and the resin part 15. Similarly, the lower face of the second lead 12 and/or the lower face of the third lead 13 can have recessed part(s) 10A.

As shown in FIG. 10C, in the case in which the lateral faces of the first lead 11 extend along the third direction (Z direction) in a cross-sectional view, the portion of the upper face of the first lead 11 meeting the lateral faces of the first lead 11 that extend along the third direction is preferably covered by the cover resin part 150. In a cross-sectional view, in the case in which the lateral faces of the first lead 11 extend along the third direction (Z direction), the length of the resin part 15 in contact with the first lead 11 tends to be smaller than the first lead 11 where an recessed part 10A is positioned as shown in FIG. 10B. However, in the case in which the cover resin part 150 covers the portion of the upper face of the first lead 11 meeting the lateral faces of the first lead 11 that extend along the third direction, the length of the resin part 15 in contact with the first lead 11 can be increased. This can reduce the occurrence of flux or the like wetting and spreading on the upper face of the first lead 11. For example, in the case of supplying power to the light emitting device 1000H from the lower face of the first lead 11, the lower face of the first lead 11 and the conductive bonding member such as solder are connected. In the case in which the lower face of the first lead 11 and solder are connected, flux or the like contained in the solder may creep up from the lower face onto the upper face of the first lead 11. In the light emitting device 1000H, by virtue of the cover resin part 150 covering the portion of the upper face of the first lead 11 meeting the lateral faces of the first lead 11 that extend along the third direction with the cover resin part 150, the length of the resin part 15 in contact with the first lead 11 can be increased. The resin part 15 in contact with the first lead 11 can stop the flow of flux or the like, thereby reducing the possibility that the flux or the like will wet and spread on the portion of the upper face of the first lead 11 exposed from the resin part 15. Similarly, in the case in which the lateral faces of the second lead 12 extend along the third direction (Z direction) in a cross-sectional view, the portion of the upper face of the second lead 12 meeting the lateral faces of the second lead 12 that extend along the third direction is preferably covered by the cover resin part 150. In a cross-sectional view, moreover, in the case in which the lateral faces of the third lead 13 extend along the third direction (Z direction) in a cross-sectional view, the portion of the upper face of the third lead 13 meeting the lateral faces of the third lead 13 that extend along the third direction is preferably covered by the cover resin part 150.

Each constituent element of a light emitting device according to the embodiments of the present disclosure will be explained below.

First Substrate 100

A first substrate 100 is a member on which a second substrate is mounted. The first substrate 100 includes at least leads 10 and a resin part 15.

Leads 10

Leads 10 are conductive members used to supply power to a light emitting element. For the base material for the leads 10, for example, metals such as copper, aluminum, gold, silver, iron, nickel, or their alloys, phosphor bronze, copper-iron alloys, or the like can be used. They can be of a single layer or multiple layers (e.g., clad materials). Particularly, for the base material, inexpensive high heat-dissipating copper is preferably used. The leads 10 can have a metal layer on the surface of the base material. Examples of metal layers include silver, aluminum, nickel, palladium, rhodium, gold, copper, or their alloys. The metal layer can be disposed on the surface of a lead 10 in whole or part. The metal layer can be varied between one formed on the upper face of a lead and one formed on the lower face of the lead. For example, the metal layer formed on the upper face of a lead can be one formed of multiple layers including nickel and silver layers, and the metal layer formed on the lower face of the lead can be one that does not include a nickel layer. For example, the metal layers such as silver layer or the like formed on the upper face of a lead can be made thicker than the metal layer such as silver layer or the like formed on the lower face of the lead.

In the case of forming a metal layer containing silver as the outermost surface of a lead 10, a protective layer formed of silicon oxide or the like is preferably formed on the surface of the metal layer containing silver. This can reduce discoloration of the silver-containing metal layer attributable to a sulfur component or the like in the air. The protective layer can be formed, for example, by vacuum process such as vacuum sputtering, but any other known method can be used.

The leads 10 include at least a first lead 11 and a second lead 12. The leads 10 can include two or more leads, and the number of leads can be three or four.

Resin Part 15

A resin part 15 is a member that holds the first lead 11 and the second lead 12 in place. For the resin material used for the resin part 15, known resins such as thermosetting resins, thermoplastic resins, and the like can be used. In the case of a thermoplastic resin, for example, polyphthalamide (PPA), polybutylene terephthalate (PBT), unsaturated polyester, or the like can be used. In the case of a thermosetting resin, for example, epoxy, modified epoxy, silicone, modified silicone, or the like can be used. The resin part 15 can contain a light reflecting material in the resin material. Examples of light reflecting materials include known materials, such as titanium oxide, silicon oxide, zirconium oxide, potassium titanate, aluminum oxide, aluminum nitride, boron nitride, mullite, and the like.

Second Substrate 200

A second substrate 200 is a member on which a light emitting element is mounted. The second substrate 200 includes a base 20, a first conducting part 21, and a second conducting part 22.

Base 20

A base 20 is an insulating member. For the material for the base 20, ceramics such as aluminum oxide, aluminum nitride, or the like, resins, glass, or their composite materials can be used. The base 20 is preferably formed using a high thermal conductivity material for heat dissipation purposes. Specifically, the base 20 preferably contains a ceramic material. Particularly, the base 20 preferably contains aluminum nitride with high heat dissipation property.

First Conducting Part 21 and Second Conducting Part 22

A first conducting part 21 and a second conducting part 22 can be formed using known conductive materials. For example, the first conducting part 21 and the second conducting part 22 can be conductive foil (conductive layer) disposed on the base 20, and are electrically connected to a light emitting element 300. The first conducting part 21 and the second conducting part 22 can be formed by plating, applying conductive paste, or printing. The thickness of each of the first conducting part 21 and the second conducting part 22 is, for example, in the range of 5 μm to 50 μm. The first conducting part 21 and/or the second conducting part 22 can be of a single layer or multiple layers.

Light Emitting Element 300

A light emitting element 300 can be a semiconductor element which itself emits light when a voltage is applied, and a known semiconductor element comprising nitride semiconductors or the like can be applied. Examples of light emitting elements include LED chips. The light emitting element includes at least semiconductor layers, and in many cases further includes an element substrate. In a top view, the light emitting element can have a quadrilateral shape, hexagonal shape, or any other polygonal shape. The light emitting element has a pair of positive and negative electrodes. The positive and negative electrodes can be constructed with gold, silver, tin, platinum, rhodium, titanium, aluminum, tungsten, palladium, nickel, or their alloys. For semiconductor materials, nitride semiconductors are preferably used. Nitride semiconductors are primarily represented by the general formula, $In_xAl_yGa_{1-x-y}N$ ($0 \leq X$, $0 \leq Y$, $X+Y \leq 1$). In addition, InAlGaAs-based semiconductors, InAlGaP-based semiconductors, zinc sulfide, zinc selenide, silicon carbide, and the like can be used. Element substrates are primarily crystal substrates for growing semiconductor crystals that construct semiconductor stacks, but can be bonding substrates to be bonded to semiconductor element structures separated from crystal substrates. Examples of base materials for the element substrate include sapphire, gallium nitride, aluminum nitride, silicon, silicon carbide, gallium arsenide, gallium phosphide, indium phosphide, zinc sulfide, zinc oxide, zinc selenide, diamond, and the like. Among all, sapphire is preferable. The thickness of the element substrate can be suitably selected, for example, in the range of 0.02 mm to 1 mm. The thickness is preferably in the range of 0.05 mm to 0.3 mm from the perspective of the element substrate strength.

Protective Device 301

A protective device 301 is a member for improving electrostatic breakdown voltage. For the protective device, various protective devices generally installed in light emitting devices can be used. For example, a Zener diode can be used for the protective device.

First Wire 401 and Second Wire 402

A first wire 401 is a member that electrically connects the first lead and the first conducting part. A second wire 402 is a member that connects the second lead and the second conducting part. For the materials used to form the first wire 401 and the second wire 402, known materials, including metals such as gold, silver, copper, platinum, aluminum, or their alloys can be used.

Wall Part 500

A wall part 500 is a member that straddles and covers the upper faces of the first lead 11 and the second lead 12. A similar material to that used for the resin part 15 can be used for the wall part 500.

Reflecting Member 700

A reflecting member 700 is a member that covers the lateral faces of a light emitting element 300. For the base resin material for the reflecting member 700, thermosetting resins, thermoplastic resins, or the like can be used. As the base material for the reflecting member 700, silicone resin or modified silicone resin with a highly heat resistant and highly light resistant is preferably used. The reflecting member 700 contains a light reflecting material in the base resin material. Examples of light reflecting materials are those known, such as titanium oxide, silicon oxide, zirconium oxide, potassium titanate, aluminum oxide, aluminum nitride, boron nitride, mullite, and the like.

Underfill 710

An underfill 710 is a member for absorbing stress attributable to the thermal expansion coefficient difference between a light emitting element 300 and the second substrate and improving the heat dissipation performance. The underfill 710 is formed in the gap between the light emitting element 300 and the second substrate 200. For the material used for the underfill 710, resin materials such as thermosetting resins and thermoplastic resins can be used. The underfill 710 can contain a light reflecting material in the resin material. Examples of light reflecting materials are those known, such as titanium oxide, silicon oxide, zirconium oxide, potassium titanate, aluminum oxide, aluminum nitride, boron nitride, mullite, and the like. The underfill 710 containing a light reflecting member can reduce the occurrence of the second substrate absorbing the light from the light emitting element.

Light Transmissive Member 800

A light transmissive member 800 is a light transmissive material that protects a light emitting element by covering the upper face of the light emitting element. For the material used to form the light transmissive member 800, resin materials such as thermosetting resins and thermoplastic resins can be used. As the base material for the light transmissive member, silicone resin or modified silicone resin with a highly heat resistant and highly light resistant is preferably used. The light transmissive member 800 can contain wavelength conversion particles and/or light diffusion particles.

Wavelength Conversion Particles

Wavelength conversion particles absorb at least a portion of the primary light emitted by a light emitting element and emit secondary light having a different wavelength from that of the primary light. Known wavelength conversion particles can be used for the wavelength conversion particles. For the wavelength conversion particles, for example, one of the specific examples described below can be used singly, or two or more can be used in combination.

Examples of green light emitting wavelength conversion particles include yttrium aluminum garnet based phosphors (e.g., $Y_3(Al,Ga)_5O_{12}$:Ce), lutetium aluminum garnet based phosphors (e.g., $Lu_3(Al,Ga)_5O_{12}$:Ce), terbium aluminum garnet based phosphors (e.g., $Tb_3(Al,Ga)_5O_{12}$:Ce), silicate based phosphors (e.g., $(Ba,Sr)_2SiO_4$:Eu), chlorosilicate based phosphors (e.g., $Ca_8Mg(SiO_4)_4C_{12}$:Eu), β-SiAlON based phosphors (e.g., $Si_{6-z}Al_zO_zN_{8-z}$:Eu (0<z<4.2)), SGS based phosphors (e.g., $SrGa_2S_4$:Eu), alkaline earth aluminate based phosphors (e.g., $(Ba,Sr,Ca)Mg_xAl_{10}O_{16+x}$:Eu,Mn (0≤X≤1)) and the like. Examples of yellow light emitting wavelength conversion particles include α-SiAlON based phosphors (e.g., $M_z(Si,Al)_{12}(O,N)_{16}$ (0<z≤2, and M is Li, Mg, Ca, Y, and lanthanide elements excluding La and Ce), and the like. Some of the green light emitting wavelength conversion particles above are also yellow light emitting wavelength conversion particles. For example, the peak emission wavelengths of yttrium aluminum garnet phosphors can be shifted to longer wavelengths by replacing a portion of Y with Gd to emit yellow light. Some of these wavelength conversion particles can emit orange light. Examples of red light emitting wavelength conversion particles include nitrogen-containing calcium aluminosilicate (CASN or SCASN) based phosphors (e.g., $(Sr,Ca)AlSiN_3$:Eu), SLAN phosphor ($SrLiAl_3N_4$:Eu) and the like. Additional examples include manganese-activated fluoride phosphors (represented by the general formula (I), $A_2[M_{1-a}Mn_aF_6]$ (in the general formula (I): "A" is at least one selected from the group consisting of K, Li, Na, Rb, Cs, and $NH_4$; "M" is at least one selected from the group consisting of Group 4 elements and Group 14 elements; and "a" satisfies 0<a<0.2)). Representative examples of the manganese-activated fluoride phosphors include manganese-activated potassium fluorosilicate phosphors (e.g., $K_2SiF_6$:Mn).

Light Diffusion Particles

For light diffusion particles, known materials, such as silicon oxide, aluminum oxide, zirconium oxide, zinc oxide, and the like can be used. One of these can be used singly, or two or more in combination. Particularly, silicon oxide having a low thermal expansion coefficient is preferable. The amount of wavelength conversion particles to be used can be reduced by using nanoparticles for the light diffusion particles which can enhance the scattering of the light emitted by a light emitting element. Nanoparticles are defined as those having a particle size of in the range of 1 nm to 100 nm. In the description herein, a "particle size" is a value defined using D50.

Cover Member 900

A cover member 900 is a member covering the first lead and the first wire. The cover member 900 can be formed by using a similar material to that used for the resin part 15. For the base material for the cover member 900, a thermosetting resin, such as an epoxy or silicone resin which is highly heat resistant is particularly preferable. The cover member 900 can contain a light reflecting material in the base resin material.

The light emitting devices according to the embodiments of the present disclosure can be utilized in vehicle headlights, backlights in liquid crystal displays, various lighting fixtures, large sized displays, various display devices such as billboards and destination signs, projectors, image pickup devices for digital video cameras, facsimiles, copiers, and scanners, and the like.

What is claimed is:

1. A light emitting device comprising:
    a first substrate comprising:
        a first lead,
        a second lead positioned apart from the first lead, and
        a resin part holding the first lead and the second lead in place;
    a second substrate disposed on an upper face of the second lead, the second substrate comprising:
        a base, and
        a first conducting part disposed on an upper face of the base;
    a light emitting element disposed on the second substrate and electrically connected to the first conducting part;
    a first wire electrically connecting the first lead and the first conducting part; and
    a wall part straddling and covering an upper face of the first lead and an upper face of the second lead,
    wherein a height of the wall part is less than a height of the second substrate, and
    wherein the resin part comprises a first cover resin part surrounded by the wall part in a top view and covering the upper face of the first lead, the first cover resin part having an inner edge with a first end that terminates at a first inner surface of the wall part and a second end that terminates at a second inner surface of the wall part, the first inner surface being perpendicular to the second inner surface wherein the first cover resin part does not overlap the second lead.

2. The light emitting device according to claim 1, wherein the wall part and the resin part are monolithic with each other.

3. The light emitting device according to claim 1, further comprising:
    a second wire,
    wherein the first substrate comprises a third lead positioned apart from the first lead and the second lead,
    wherein the second substrate comprises a second conducting part positioned on the upper face of the base apart from the first conducting part, and
    wherein the second wire electrically connects the third lead and the second conducting part.

4. The light emitting device according to claim 3, wherein, in a top view:
    the first lead and the second lead face each other in a first direction,
    the second lead and the third lead face each other in the first direction, and
    the first lead and the third lead face each other in a second direction that is orthogonal to the first direction.

5. The light emitting device according to claim 3, wherein:
    the wall part straddles and covers the upper face of the second lead and an upper face of the third lead.

6. The light emitting device according to claim 3, wherein:
    the wall part straddles and covers the upper face of the first lead and the upper face of the third lead.

7. The light emitting device according to claim 1, further comprising:
    a second wire,
    wherein the second substrate comprises a second conducting part positioned on the upper face of the base apart from the first conducting part, and
    wherein the second wire electrically connects the second lead and the second conducting part.

8. The light emitting device according to claim 1, wherein:
    the wall part surrounds the second substrate without a break in a top view.

9. The light emitting device according to claim 1, wherein:
    a ratio of the height of the wall part to a width of the wall part in a cross-sectional view is at least 0.2, and less than 1.

10. The light emitting device according to claim 1, further comprising:
    a reflecting member covering one or more lateral faces of the light emitting element.

11. The light emitting device according to claim 10, wherein:
    the reflecting member is positioned apart from the first wire.

12. The light emitting device according to claim 1, further comprising:
    a light transmissive member covering an upper face of the light emitting element.

13. The light emitting device according to claim 12, wherein:
    a height of the light transmissive member is greater than a height of the first wire.

14. The light emitting device according to claim 12, further comprising:
    at least one additional light emitting element,
    wherein the light transmissive member covers the upper faces of the light emitting element and an upper face of the at least one additional light emitting element.

15. The light emitting device according to claim 1, wherein:
    the first wire is a ribbon wire.

16. The light emitting device according to claim 1, wherein:
    the base contains aluminum nitride.

17. The light emitting device according to claim 12, wherein:
    a height of the light transmissive member is lower than a height of the first wire.

18. The light emitting device according to claim 1, wherein a portion of an upper face of the first lead meeting a lateral face of the first lead is covered by the first cover resin part.

19. The light emitting device according to claim 1,
    wherein the first substrate comprises a third lead positioned apart from the first lead and the second lead,
    wherein the resin part includes a second cover resin part covering the upper surface of the third lead, the second cover resin part comprising a first end located at a third inner surface of the wall part and a second end located at the second inner surface, the third inner surface being parallel to and opposing the first inner surface, the second inner surface extending between the first inner surface and the third inner surface, and wherein the second cover resin part extends from an intersection between the third inner surface and the second inner surface.

20. The light emitting device according to claim 1, wherein the first cover resin part has an upper face lower in height than the wall part.

21. The light emitting device according to claim 1, wherein:
  the first lead has a protrusion that is recessed from a lower face of the first lead at a periphery of the first lead; and
  the first cover resin part is located above the protrusion, and another portion of the resin part is located below the protrusion.

* * * * *

UNITED STATES PATENT AND TRADEMARK OFFICE
CERTIFICATE OF CORRECTION

PATENT NO. : 11,769,862 B2
APPLICATION NO. : 17/211473
DATED : September 26, 2023
INVENTOR(S) : Dai Wakamatsu et al.

It is certified that error appears in the above-identified patent and that said Letters Patent is hereby corrected as shown below:

In the Claims

Claim 1, Column 19, Lines 32-40:
Please delete:
"wherein the resin part comprises a first cover resin part surrounded by the wall part in a top view and covering the upper face of the first lead, the first cover resin part having an inner edge with a first end that terminates at a first inner surface of the wall part and a second end that terminates at a second inner surface of the wall part, the first inner surface being perpendicular to the second inner surface wherein the first cover resin part does not overlap the second lead."

Please replace with:
wherein the resin part comprises a first cover resin part surrounded by the wall part in a top view and covering the upper face of the first lead, the first cover resin part having an inner edge with a first end that terminates at a first inner surface of the wall part and a second end that terminates at a second inner surface of the wall part, the first inner surface being perpendicular to the second inner surface, and
wherein the first cover resin part does not overlap the second lead.

Signed and Sealed this
Ninth Day of January, 2024

Katherine Kelly Vidal
*Director of the United States Patent and Trademark Office*